(12) United States Patent
Kawai et al.

(10) Patent No.: US 10,527,677 B2
(45) Date of Patent: Jan. 7, 2020

(54) BATTERY STATE ESTIMATION APPARATUS

(71) Applicant: DENSO CORPORATION, Kariya, Aichi-pref. (JP)

(72) Inventors: Toshiyuki Kawai, Kariya (JP); Keiichi Kato, Kariya (JP); Yuuji Koike, Kariya (JP)

(73) Assignee: DENSO CORPORATION, Kariya (JP)

( * ) Notice: Subject to any disclaimer, the term of this patent is extended or adjusted under 35 U.S.C. 154(b) by 444 days.

(21) Appl. No.: 14/879,761

(22) Filed: Oct. 9, 2015

(65) Prior Publication Data

US 2016/0103184 A1    Apr. 14, 2016

(30) Foreign Application Priority Data

Oct. 9, 2014   (JP) .................................. 2014-208263
Sep. 14, 2015  (JP) .................................. 2015-181048

(51) Int. Cl.
   *G01R 31/367*    (2019.01)
   *G01R 31/389*    (2019.01)
   *G01R 31/374*    (2019.01)

(52) U.S. Cl.
   CPC ......... *G01R 31/367* (2019.01); *G01R 31/389* (2019.01); *G01R 31/374* (2019.01)

(58) Field of Classification Search
   CPC ....................... G01R 31/3651; G01R 31/3662

(Continued)

(56) References Cited

U.S. PATENT DOCUMENTS

2007/0210742 A1*  9/2007  Brecht .................. H02J 7/0091
                                          320/104
2010/0085057 A1*  4/2010  Nishi .................. G01R 31/3624
                                          324/427

(Continued)

FOREIGN PATENT DOCUMENTS

JP      2010-203885 A    9/2010
JP      2012-159414 A    8/2012

OTHER PUBLICATIONS

E. Kuhn et al. "Modelling Ni-mH battery using Cauer and Foster structures," Journal of Power Sources, vol. 158, pp. 1490-1497, 2006.

*Primary Examiner* — Huan Hoang
*Assistant Examiner* — Muna A Techane
(74) *Attorney, Agent, or Firm* — Oliff PLC

(57) ABSTRACT

A battery state estimation apparatus estimates a state of a secondary battery based on a battery model thereof. The battery model includes a DC resistance model, a reaction resistance model, and a diffusion resistance model. The apparatus includes a DC information storage section which stores information on the DC resistance related to temperature of the secondary battery, a reaction information storage section which stores information on the reaction resistance parameter related to the temperature, a diffusion information storage section which stores information on each of the first and second parameters related to the temperature, and a state estimation section which calculates the DC resistance, the reaction resistance parameter, and the first and second parameters from the stored information, by using the temperature as input, and estimates the state of the secondary battery based on the DC resistance, reaction resistance parameter, and first and second parameters.

6 Claims, 13 Drawing Sheets

(58) Field of Classification Search
USPC .......................................................... 702/63
See application file for complete search history.

(56) References Cited

U.S. PATENT DOCUMENTS

| | | | |
|---|---|---|---|
| 2013/0218496 A1* | 8/2013 | Koch ...................... | B60L 58/10 |
| | | | 702/63 |
| 2014/0132222 A1* | 5/2014 | Joe ...................... | G01R 31/3651 |
| | | | 320/134 |
| 2015/0032394 A1* | 1/2015 | Kimura ................ | G01R 31/362 |
| | | | 702/63 |
| 2016/0052419 A1* | 2/2016 | Takahashi ............... | B60L 58/12 |
| | | | 429/61 |

* cited by examiner

PRESENT EMBODIMENT

BATTERY STATE ESTIMATION APPARATUS

CROSS-REFERENCE TO RELATED APPLICATION

This application is based on and claims the benefit of priority from earlier Japanese Patent Applications No. 2014-208263 filed Oct. 9, 2014 and No. 2015-181048 filed Sep. 14, 2015, the descriptions of which are incorporated herein by reference.

BACKGROUND

Technical Field

The present invention relates to a battery state estimation apparatus which estimates a state of a secondary battery based on a battery model of the secondary battery.

Related Art

As described in JP-A-2012-159414, this type of apparatus is known which estimates a battery state including a nonlinear domain of current-voltage characteristics of a secondary battery based on a battery model (hereinafter, referred to as a 1RC equivalent circuit model) configured by a DC resistance and an RC equivalent circuit. Specifically, since the time constant is small, electrolyte resistance and both charge-transfer resistance and electric double capacitance are simulated by one DC resistance, and diffusion resistance is expressed by a parallel circuit of a resistor R and a capacitor C.

According to the above conventional art, the 1RC equivalent circuit model does not have a configuration for expressing characteristics of a nonlinear domain. Hence, a filter is set to attenuate a signal of the nonlinear domain and perform calculation by using only data of a linear domain, to react the nonlinear domain. It is known that current-voltage nonlinear characteristics of a secondary battery become dominant as the secondary battery becomes lower in temperature. Specifically, in a domain in which temperature is 0° or less, the nonlinear domain cannot be ignored. Hence, according to the above technique, the amount of data, which can be used for calculation, becomes smaller in a temperature region of 0° or less, which makes the calculation inaccurate. This causes a concern that the accuracy in state estimation of the secondary battery lowers.

SUMMARY

An embodiment provides a battery state estimation apparatus which can estimate a state of a secondary battery with high accuracy at low temperature.

As an aspect of the embodiment, a battery state estimation apparatus estimates a state of a secondary battery based on a battery model of the secondary battery. The battery model includes: a DC resistance model which expresses DC resistance of the secondary battery; a reaction resistance model which expresses reaction resistance of the secondary battery and is derived from a Butler-Volmer equation, and which includes a reaction resistance parameter correlated with an exchange current density; and a diffusion resistance model which is an equivalent circuit model in which a plurality of parallel connections of a resistor and a capacitor are connected in series, and expresses diffusion resistance of the secondary battery, the diffusion resistance including a common first parameter which determines a resistance value of each of the resistors and capacitance of each of the capacitors, and a common second parameter which determines the capacitance of each of the capacitors. The apparatus includes: a DC information storage section which stores information on the DC resistance related to temperature of the secondary battery; a reaction information storage section which stores information on the reaction resistance parameter related to the temperature of the secondary battery; a diffusion information storage section which stores information on each of the first parameter and the second parameter related to the temperature of the secondary battery; and a state estimation section which calculates the DC resistance, the reaction resistance parameter, the first parameter, and the second parameter from the information stored in the DC information storage section, the reaction information storage section, and the diffusion information storage section, by using the temperature of the secondary battery as input, and estimates the state of the secondary battery based on the calculated DC resistance, reaction resistance parameter, first parameter, and second parameter.

DETAILED DESCRIPTION OF THE PREFERRED EMBODIMENTS

First Embodiment

Hereinafter, a battery state estimation apparatus according to the first embodiment is described with reference to the drawings. In the present embodiment, the apparatus is applied to, for example, a vehicle including a rotating electrical machine (motor generator) serving as an in-vehicle traction unit, or a vehicle utilizing an in-vehicle auxiliary unit battery for, for example, an idling stop system.

Figure 1:
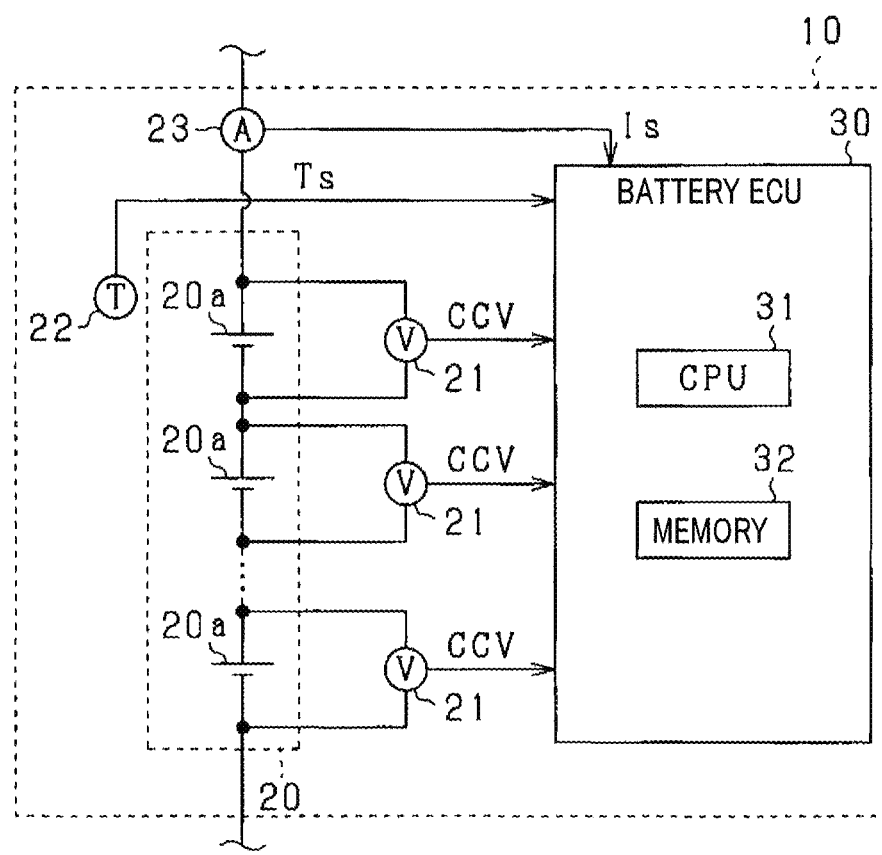
FIG. 1 is a diagram showing a configuration of a battery pack according to a first embodiment.

As shown in FIG. 1, a battery pack 10 includes an assembled battery 20 and a battery ECU (electronic control unit) 30. The assembled battery 20 is configured by a series connection of a plurality of battery cells 20a and supplies or receives electric power to or from a motor generator or the like, which is not shown. The battery cells 20a are secondary batteries. In the present embodiment, lithium-ion secondary batteries are used.

The battery pack 10 includes voltage sensors 21, a temperature sensor 22, and a current sensor 23. The voltage sensors 21 are voltage detection means for detecting voltage across the terminals of each of the battery cells 20a. The temperature sensor 22 is a temperature detection means for detecting temperature of the assembled battery 20 (battery cells 20a). The current sensor 23 is a current detection means for detecting charging and discharging current flowing through the assembled battery 20.

The battery ECU 30 is configured as a computer including a CPU 31, a memory 32 (storage device), and an I/O, which is not shown. The battery ECU 30 receives detection values of the voltage sensors 21 and the temperature sensor 22.

Figure 2:
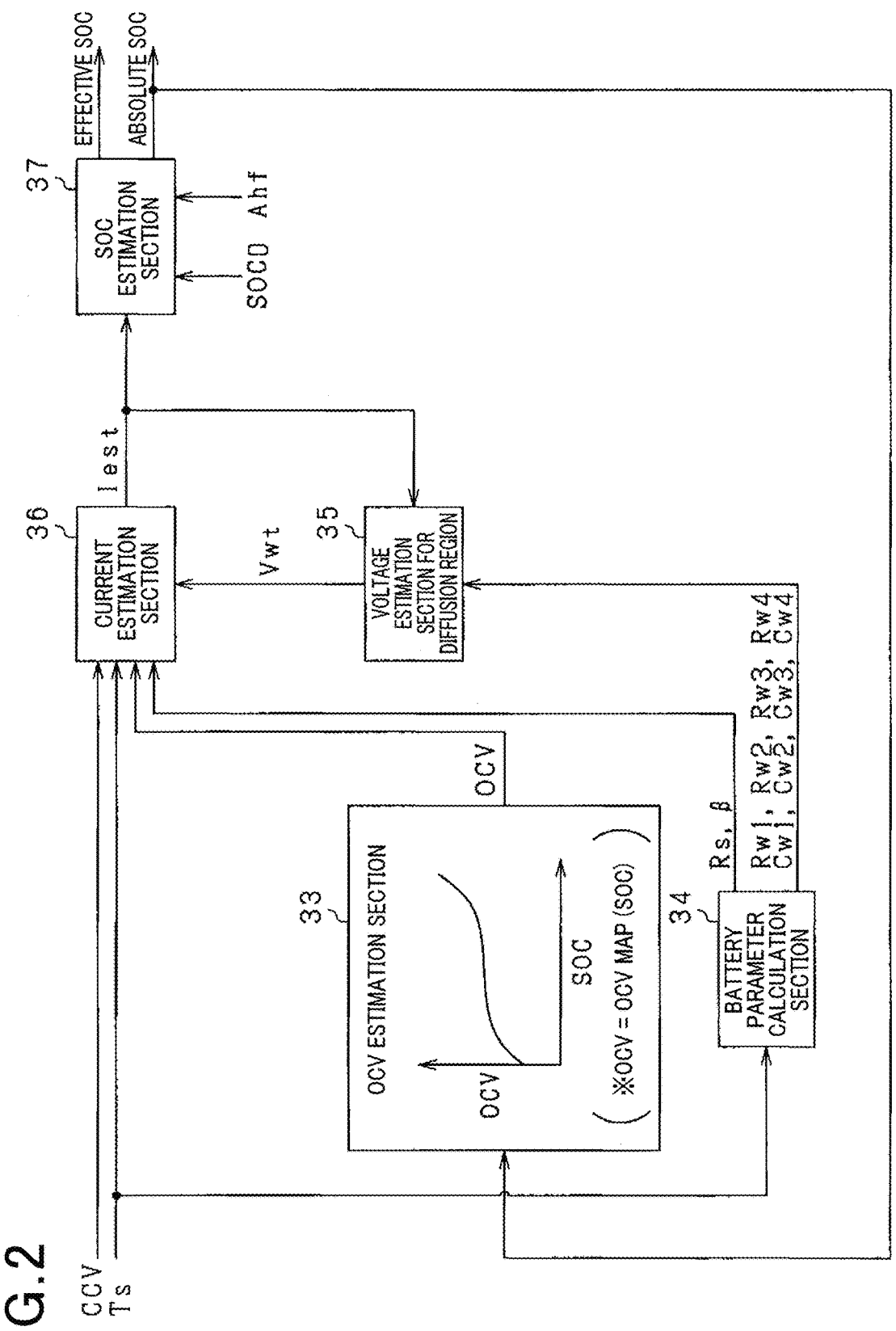
FIG. 2 is a block diagram showing a process of a battery ECU.

Next, with reference to FIG. 2, a process performed by the battery ECU 30 (CPU 31) is described. The battery ECU 30 includes an OCV (Open Circuit Voltage) estimation section 33, a battery parameter calculation section 34, a voltage estimation section 35 for a diffusion region, a current estimation section 36, and an SOC (State of Charge) estimation section 37.

The OCV estimation section 33 calculates open end voltage OCV of the battery cells 20a based on absolute SOC calculated by an SOC estimation section 37 described later. The absolute SOC is calculated during the last processing period of the battery ECU 30. In addition, in the present embodiment, the open end voltage OCV is calculated by using an OCV map in which absolute SOC and open end voltage OCV are previously related to each other. In the present embodiment, the OCV map is stored in the memory 32. Note that the absolute SOC is a ratio of the present amount of charge to rating capacity Ah0 of the battery cells 20a. If defining dischargeable capacity of the battery cells 20a as full charge capacity Ahf when the battery cells 20a discharge at the present temperature from a state of full charge, the rating capacity Ah0 is the maximum value of the full charge capacity Ahf. The rating capacity Ah0 depends on the temperature of the battery cells 20a.

Figure 3:
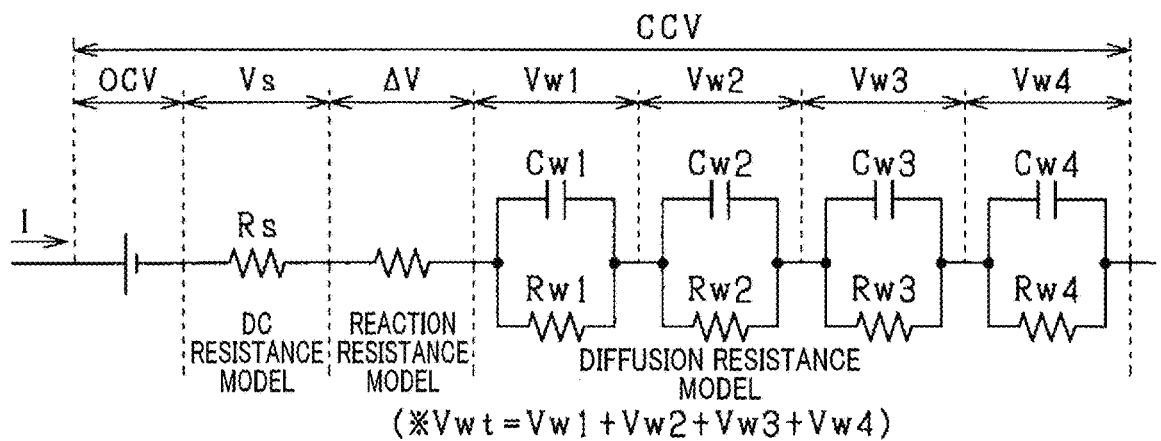
FIG. 3 is a diagram showing a battery model.

The battery parameter calculation section 34 and the voltage estimation section 35 for a diffusion region estimate each parameter of the battery cells 20a shown in FIG. 3. FIG. 3 shows a battery model expressing internal impedance and the like. In the present embodiment, the battery model is expressed as a series connection of a DC resistance model, a reaction resistance model, and a diffusion resistance model. In FIG. 3, Rs is a DC resistance indicating conduction resistance in a solution or of electrodes, and Vs is a potential difference across the DC resistance Rs. ΔV is a potential difference across a reaction resistance indicating electrode interface reaction at the positive electrode and the negative electrode. Rw1, Rw2, Rw3, and Rw4 are resistance components of the diffusion resistance indicating ion diffusion in an active material or a solution. Cw1, Cw2, Cw3, and Cw4 are capacity component terms for expressing a variation in resistance with elapsed time. Vw1, Vw2, Vw3, and Vw4 are potential differences across each diffusion resistance. The diffusion resistance is configured by connecting a plurality of parallel connections of a resistance component and a capacity component in series. The equivalent circuit formed by connecting the resistance component and the capacity component is referred to as a Foster-type equivalent circuit.

Note that, in the present embodiment, the reaction resistance model shown in FIG. 3 is expressed only by DC resistances, and any time constant of the model is ignored. This is because, in the present embodiment, one processing period of the battery ECU 30 (CPU 31) is set so as to be sufficiently longer than the time constant of the reaction resistance.

Returning to the explanation of FIG. 2, the current estimation section 36 calculates a estimation value (hereinafter, referred to as estimation current Jest) of charging and discharging current flowing through the assembled battery 20 based on voltage across the terminals CCV of each of the battery cells 20a detected by the voltage sensor 21, battery temperature Ts detected by the temperature sensor 22, open end voltage OCV calculated by the OCV estimation section 33, and each parameter calculated by the voltage estimation section 35 for the diffusion region. Note that since the battery cells 20a are connected in series, the estimation current Jest is a common charging and discharging current flowing through each of the battery cells 20a.

The SOC estimation section 37 calculates absolute SOC and effective SOC. The effective SOC is a ratio of the present amount of charge to the full charge capacity Ahf. The SOC estimation section 37 calculates the absolute SOC [%] based on initial SOC0 which is an initial value of SOC, an integrated value of the estimation currents Jest calculated by the current estimation section 36 from the time when the absolute SOC is the initial SOC0, and the rating capacity Ah0. Specifically, the absolute SOC is calculated by the following expression (eq1).

$$\text{Absolute } SOC = SOC0 + \frac{\sum Is \cdot dt}{Ah0} \times 100 \quad \text{(eq 1)}$$

Note that the initial SOC0 may be calculated, for example, as follows. Specifically, on condition that charging and discharging of the assembled battery 20 is stopped, voltage across the terminals of the battery cell 20a is detected by the voltage sensor 21 as the open end voltage OCV. Then, the initial SOC0 is calculated by using the OCV map by using the detected open end voltage OCV as input.

The SOC estimation section 37 calculates the effective SOC [%] based on the initial SOC0, the integrated value of the estimation currents Jest obtained from the time when the absolute SOC is the initial SOC0, and the full charge capacity Ahf. Specifically, the effective SOC is calculated by the following expression (eq2).

$$\text{Effective } SOC = SOC0 + \frac{\sum Is \cdot dt}{Ahf} \times 100 \quad \text{(eq 2)}$$

The full charge capacity Ahf may be calculated based on, for example, the battery temperature Ts, or the battery temperature Ts and a degeneration state of the battery cells 20a. For example, when considering the degeneration of the battery, the rating capacity Ah0 may be defined as full charge capacity at room temperature of 25° C. The absolute SOC and the effective SOC calculated by the above methods are used for various calculations concerning the battery cells 20a performed by the battery ECU 30, or are outputted to a higher controller (e.g. controller centralizing vehicle control) via a communication network such as CAN or LIN.

Next, the battery parameter calculation section 34, the voltage estimation section 35, and the current estimation section 36 are explained in detail.

First, the battery parameter calculation section 34 is explained with reference to FIG. 4.

The battery parameter calculation section 34 includes an Rs calculation section 34a, a β calculation section 34b, an Rd calculation section 34c, a resistance component calculation section 34d, a τd calculation section 34e, and a capacity component calculation section 34f.

Figure 5:
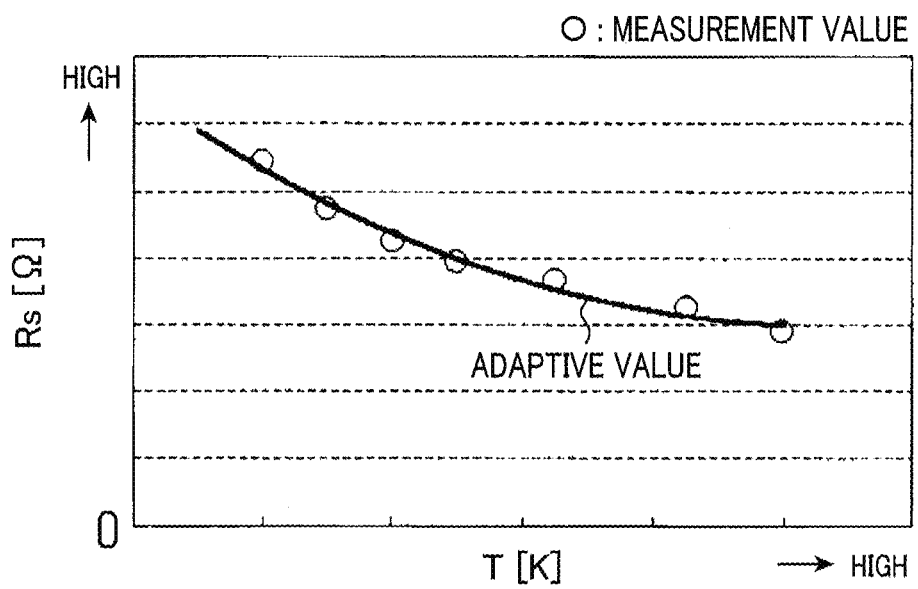
FIG. 5 is a diagram showing a relationship between DC resistance and battery temperature.

The Rs calculation section 34a calculates DC resistance Rs based on the battery temperature Ts. The reason why the battery temperature Ts is used for calculating the DC resistance Rs is that the DC resistance Rs depends on the temperature of the battery cells 20a. In the present embodiment, the DC resistance Rs is calculated by using an Rs map in which the DC resistance Rs and the battery temperature Ts are previously related to each other. In the present embodiment, as shown in FIG. 5, the Rs map is adapted so that as the battery temperature Ts is higher, the DC resistance Rs becomes lower. In FIG. 5, the DC resistance Rs is measured by using an impedance analyzer. In the present embodiment, the Rs map is stored in the memory 32. Note that, in the present embodiment, the Rs calculation section 34a corresponds to a DC information storage means (section).

The β calculation section 34b calculates a reaction resistance parameter β, which is a parameter concerning reaction resistance, based on the battery temperature Ts. The reason why the battery temperature Ts is used for calculating the reaction resistance parameter β is that the reaction resistance parameter β depends on the temperature of the battery cells 20a. In the present embodiment, the β calculation section 34b corresponds to a reaction information storage means (section). In the present embodiment, the reaction resistance parameter 3 is calculated by using a β map in which a natural logarithm 1nβ of the reaction resistance parameter β and an inverse 1/Ts of the battery temperature Ts (absolute temperature) are previously related to each other. Hereinafter, a method of generating the β map is explained.

The Butler-Volmer equation in electrochemistry is expressed by the following expression (eq3).

$$i = io \left\{ \exp\left(\frac{\alpha_s nF\eta}{RT}\right) - \exp\left(\frac{-(1-\alpha_s)nF\eta}{RT}\right) \right\} \quad \text{(eq 3)}$$

In the above expression (eq3), i is a current density, io is an exchange current density, αs is a transfer coefficient of an electrode reaction (oxidation reaction), n is the charge number, F is the Faraday constant, η is overvoltage, R is the gas constant, and T is the absolute temperature.

In the above expression (eq3), for simplicity, assuming that the positive and negative electrodes are equivalent (that is, charge and discharge efficiency is the same), and that a=αs=1−αs, the above expression (eq3) is modified to the following expression (eq4).

$$i = io \left\{ \exp\left(\frac{anF\eta}{RT}\right) - \exp\left(\frac{-anF\eta}{RT}\right) \right\} \quad \text{(eq 4)}$$

By using the relationship between a hyperbolic since function and an exponential function, the above expression (eq4) is modified to the following expression (eq5).

$$i = 2 \cdot io \cdot \sinh\left(\frac{anF\eta}{RT}\right) \quad \text{(eq 5)}$$

Determining the overvoltage η from the above expression (eq5) leads to the following expression (eq6).

$$\eta = \frac{RT}{anF} \sinh^{-1}\left(\frac{1}{2 \cdot io} i\right) \quad \text{(eq 6)}$$

Meanwhile, the relationship between the overvoltage η and the potential difference ΔV across a reaction resistance is expressed as the following expression (eq7) by using a constant of proportionality γ. In addition, the relationship between the current density i and the current I flowing through the battery cells is expressed by the following expression (eq8) by using the constant of proportionality γ.

$$\eta = \gamma \cdot \Delta V \quad \text{(eq7)}$$

$$i = \gamma \cdot I \quad \text{(eq8)}$$

Substituting the above expressions (eq7) and (eq8) into the above expression (eq6) leads to the following expression (eq9).

$$\gamma \cdot \Delta V = \frac{RT}{anF} \sinh^{-1}\left(\frac{1}{2 \cdot io} \gamma \cdot I\right) \quad \text{(eq 9)}$$

The above expression (eq9) is reorganized into the following expression (eq10).

$$\Delta V = \frac{\alpha}{\gamma} T \cdot \sinh^{-1}(\beta \cdot \gamma \cdot I) \quad \text{(eq 10)}$$

where $$\alpha = \frac{R}{anF}, \beta = \frac{1}{2 \cdot io}$$

Note that substituting the above expressions (eq7) and (eq8) into the above expression (eq5) leads to the following expression (eq11).

$$I = \frac{1}{\gamma \cdot \beta} \sinh\left(\frac{\gamma}{\alpha} \cdot \frac{1}{T} \Delta V\right) \quad \text{(eq 11)}$$

In the above equations (eq10) and (eq11), β is the reaction resistance parameter. The above equations (eq10) and (eq11) indicate that the charging and discharging current I flowing through the battery cells and the potential difference ΔV across the reaction resistance can be related to each other by the reaction resistance parameter β. As seen from the above expression (eq11), the reaction resistance parameter β derived from the Butler-Volmer equation is a coefficient, which defines the relationship between the hyperbolic since function sin h and a dependent variable I, in a hyperbolic since function whose independent variable is a potential difference ΔV across a reaction resistance and whose dependent variable is a current flowing through the battery cells.

Figure 6:
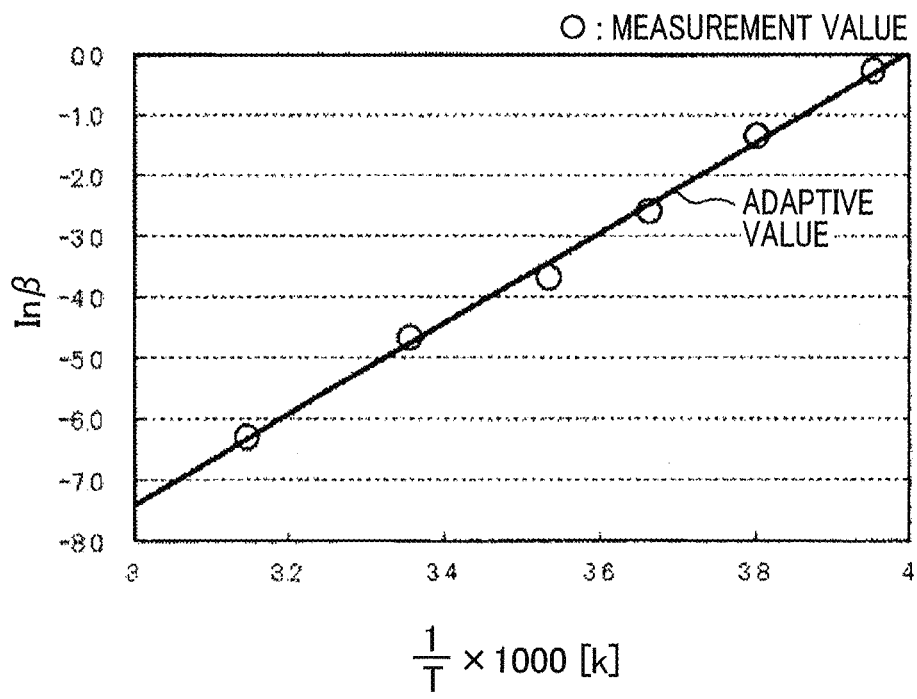
FIG. 6 is a diagram showing a relationship between reaction resistance parameter and battery temperature.

Since the exchange current density io depends on the battery temperature T, the reaction resistance parameter β also depends on the battery temperature T. FIG. 6 shows a measurement result of the dependency. FIG. 6 is a diagram showing the natural logarithm of the reaction resistance parameter β and the inverse of the battery temperature T according to an Arrhenius plot. Specifically, in the present embodiment the reaction resistance parameter β is adapted by the following expression (eq12) based on the measurement result of the reaction resistance parameter β (refer to the solid line in FIG. 6).

$$\ln \beta = c1 \cdot \frac{1}{T} + c2 \qquad (\text{eq 12})$$

Figure 7:
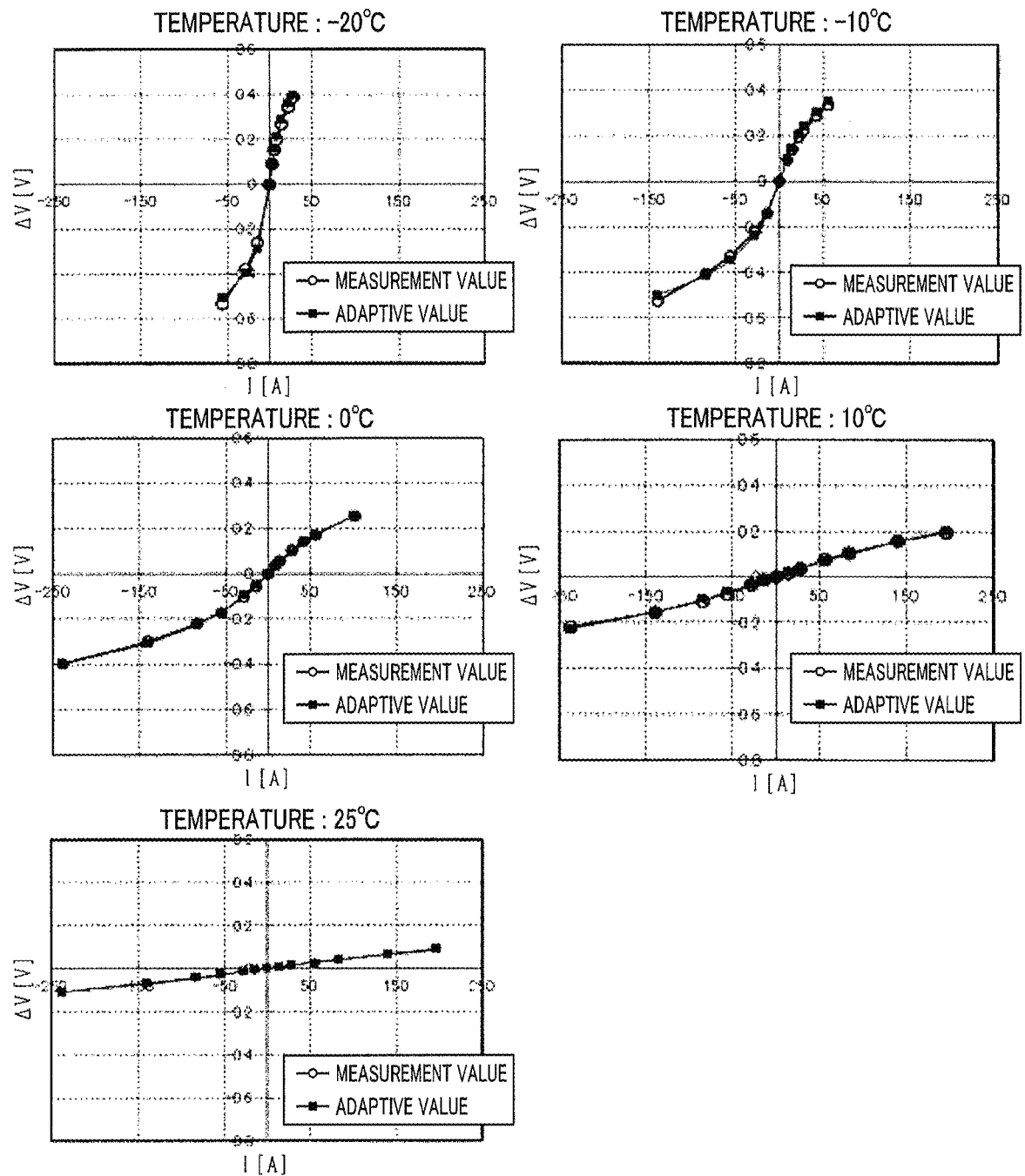
FIG. 7 is a diagram showing a temperature dependency of current-voltage characteristics of reaction resistance.

In the above expression (eq12), c1 and c2 are constants. The β calculation section 34b calculates the reaction resistance parameter β by using the β map based on the above expression (eq12). FIG. 7 shows a relationship between the potential difference ΔV across the reaction resistance and the charging and discharging current I in a case where the reaction resistance parameter β adapted as described above is used. As shown by measurement values in FIG. 7, when the temperature of the battery cells is lower, current-voltage nonlinear characteristics tend to be dominant. As shown by adaptive values shown in FIG. 7, using the reaction resistance parameter β can accurately represent the tendency.

In the above expression (eq12), adaptation is made by a primary expression of an inverse of the battery temperature T. However, as shown in the following expression (eq13), adaptation may be made by a primary expression of the battery temperature T.

$$\ln \beta = d1 \cdot T + d2 \qquad (\text{eq13})$$

In the above expression (eq13), d1 and d2 are constants. In both cases of the above expression (eq12) and the above expression (eq13), nonlinear characteristics at lower temperature may be represented by the reaction resistance parameter β.

Figure 4:
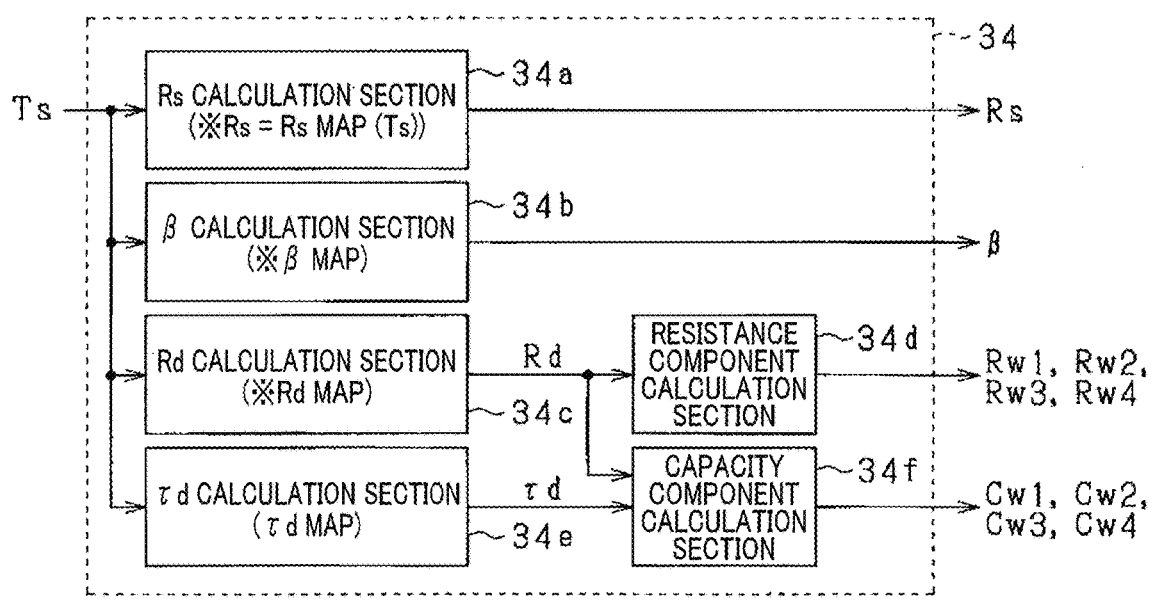
FIG. 4 is a block diagram showing a process of a battery parameter calculation section.

Returning to the explanation of FIG. 4, the Rd calculation section 34c, the resistance component calculation section 34d, the τd calculation section 34e, and the capacity component calculation section 34f calculate parameters concerning diffusion resistance. Hereinafter, after the parameters concerning diffusion resistance are explained, processes of the calculation sections 34c, 34d, 34e, and 34f are explained. In the present embodiment, the Rd calculation section 34c and the τd calculation section 34e correspond to a diffusion information storage means (section).

Based on a diffusion equation in electrochemistry, the Warburg impedance Z concerning diffusion resistance is derived. The impedance Z is expressed by the following expression (eq14).

$$Z = \frac{\Delta v}{\Delta i} = \frac{\frac{RT}{nF} \cdot \frac{\Delta C|_{x=0}}{Co}}{-nFD \frac{\partial \Delta C}{\partial x}\Big|_{x=0}} \qquad (\text{eq 14})$$

In the above expression (eq14), the numerator is based on the Nernst equation which represents that electromotive force is proportional to a natural logarithm of a surface concentration of a substance. In the numerator, Co is an average concentration, ΔC is concentration change with respect to the average concentration Co, and x is a distance from the electrode. The denominator is based on Fick's first law which represents that the amount of substance passing through a unit area in a unit of time is proportional to a concentration gradient. In the denominator, D is a diffusion coefficient.

The above expression (eq14) is organized into the following expression (eq15).

$$Z = \frac{RT}{n^2 F^2 D Co} \cdot \frac{\Delta C|_{x=0}}{-\frac{\partial \Delta C}{\partial x}\Big|_{x=0}} \qquad (\text{eq 15})$$

In a case where AC voltage is applied to the electrode, it is assumed that, if the voltage changes in the form of a sinusoidal wave, the concentration also changes in the form of a sinusoidal wave. In this case, the concentration change ΔC is expressed by the following expression (eq16) by using an imaginary j and an angular velocity ω.

$$\Delta v = |\Delta v| \exp(j\omega t), \Delta C = |\Delta C| \exp(j\omega t) \qquad (\text{eq16})$$

In the above expression (eq16), |Δv| and |ΔC| are complex amplitudes. Fick's second law is expressed by the following expression (eq 17).

$$\frac{\partial \Delta C}{\partial t} = \frac{\partial^2 \Delta C}{\partial x^2} \qquad (\text{eq 17})$$

The left-hand side of the above expression (eq17) is a time differential value, thereby becoming jωΔC. Hence, a general solution of the above expression (eq17) is expressed by the following expression (eq18) by using constants k1 and k2.

$$\Delta C = k1 \cdot \exp\left(\sqrt{\frac{j\omega}{D}} x\right) + k2 \cdot \exp\left(-\sqrt{\frac{j\omega}{D}} x\right) \qquad (\text{eq 18})$$

L is defined as a diffusion length. On condition that the concentration change ΔC is 0 when x=L, the above expression (eq18) is modified to the following expression (eq19).

$$0 = k1 \cdot \exp\left(\sqrt{\frac{j\omega}{D}} L\right) + k2 \cdot \exp\left(-\sqrt{\frac{j\omega}{D}} L\right) \to k2 = \qquad (\text{eq 19})$$

$$-k1 \cdot \exp\left(\sqrt{\frac{j\omega}{D}} 2L\right)$$

Hence, the concentration change ΔC is expressed by the following expression (eq20).

$$\Delta C = k1 \cdot \exp\left(\sqrt{\frac{j\omega}{D}} x\right) - k1 \cdot \exp\left(\sqrt{\frac{j\omega}{D}} 2L\right) \cdot \qquad (\text{eq 20})$$

$$\exp\left(-\sqrt{\frac{j\omega}{D}} x\right)$$

$$= k1 \cdot \exp\left(\sqrt{\frac{j\omega}{D}} L\right) \left\{ \exp\left(\sqrt{\frac{j\omega}{D}} (x-L)\right) - \right.$$

-continued $$\exp\left(-\sqrt{\frac{j\omega}{D}}(x-L)\right)\right\}$$

$$= 2 \cdot k1 \cdot \exp\left(\sqrt{\frac{j\omega}{D}}L\right) \cdot \sinh\left(\sqrt{\frac{j\omega}{D}}(x-L)\right)$$

$$= k \cdot \exp\left(\sqrt{\frac{j\omega}{D}}L\right) \cdot \sinh\left(\sqrt{\frac{j\omega}{D}}(x-L)\right)$$

Partially differentiating the above expression (eq20) by x leads to the following expression (eq21).

$$\frac{\partial \Delta C}{\partial x} = \sqrt{\frac{j\omega}{D}} \cdot k \cdot \exp\left(\sqrt{\frac{j\omega}{D}}L\right) \cdot \cosh\left(\sqrt{\frac{j\omega}{D}}(x-L)\right) \quad (eq\ 21)$$

Substituting the above expressions (eq20) and (eq21) into the above expression (eq15) leads to the following expression (eq22) which is part of the above expression (eq15).

$$\frac{\Delta C|_{x=0}}{-\frac{\partial \Delta C}{\partial x}\Big|_{x=0}} = \frac{k \cdot \sinh\left(-\sqrt{\frac{j\omega}{D}}L\right)}{-\sqrt{\frac{j\omega}{D}} \cdot k \cdot \cosh\left(-\sqrt{\frac{j\omega}{D}}L\right)} = \sqrt{\frac{D}{j\omega}} \cdot \tanh\left(\sqrt{\frac{j\omega}{D}}L\right) \quad (eq\ 22)$$

Hence, Warburg impedance Z of the above expression (eq15) can be expressed by the following expression (eq23) by using a Laplace operator s ($=j\times\omega$).

$$Z = \frac{RT}{n^2 F^2 DCo} \cdot \sqrt{\frac{D}{j\omega}} \tanh\left(\sqrt{\frac{j\omega}{D}}L\right) \quad (eq\ 23)$$

$$= \frac{RTL}{n^2 F^2 DCo} \cdot \frac{1}{\sqrt{\frac{L^2}{D}s}} \tanh\left(\sqrt{\frac{L^2}{D}s}\right)$$

$$= \frac{Rd}{\sqrt{\tau d \cdot s}} \tanh\left(\sqrt{\tau d \cdot s}\right)$$

where $$Rd = \frac{RT}{n^2 F^2 DCo},\ \tau d = \frac{L^2}{D}$$

In the present embodiment, Rd is referred to as a first parameter, and Td is referred to as a second parameter. The diffusion coefficient D is expressed by the following expression (eq24).

$$D = Do \cdot \exp\left(-\frac{E}{RT}\right) \quad (eq\ 24)$$

In the above expression (eq24), Do is a constant which is not dependent on temperature, and E is activation energy. By using the above expression (eq24), the first and second parameters Rd and τd can be expressed by the following expression (eq25).

$$Rd = \frac{RTL}{n^2 F^2 Co} \cdot \frac{1}{Do} \exp\left(\frac{E}{RT}\right), \quad (eq\ 25)$$

$$\tau d = \frac{L^2}{Do} \exp\left(\frac{E}{RT}\right)$$

The above expression (eq25) represents that the first and second parameters Rd and τd are dependent on the temperature T. Finding the natural logarithm of the above expression (eq25) leads to the following expression (eq26).

$$\ln(Rd) = \frac{E}{R} \cdot \frac{1}{T} + \ln\left(\frac{RTL}{n^2 F^2 Co} \cdot \frac{1}{Do}\right), \quad (eq\ 26)$$

$$\ln(\tau d) = \frac{E}{R} \cdot \frac{1}{T} + \ln\left(\frac{L^2}{Do}\right)$$

Figure 8A:
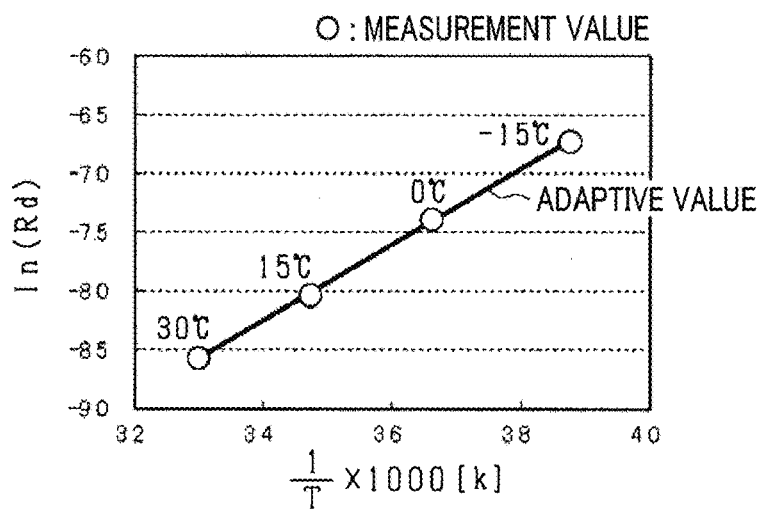
FIGS. 8A and 8B are diagrams showing relationships between first and second parameters and battery temperature.
Figure 8B:
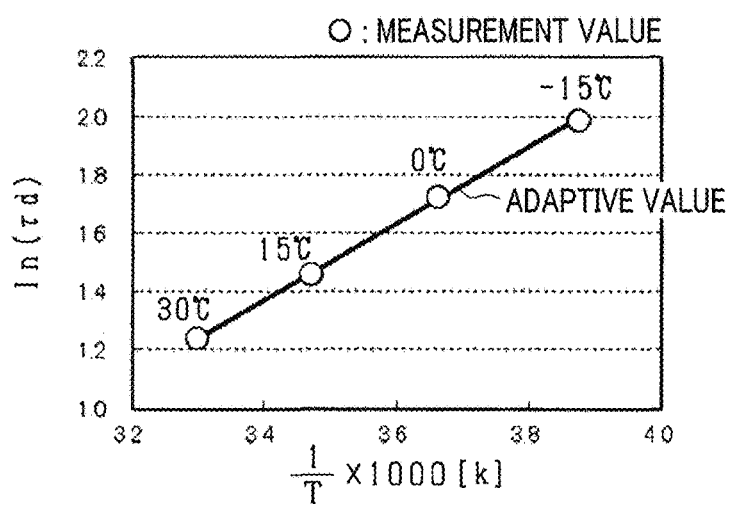

FIGS. 8A and 8B show measurement results representing that the first and second parameters Rd and τd have temperature dependencies. FIGS. 8A and 8B are diagrams showing relationships between the natural logarithms of the first and second parameters Rd and τd and an inverse of the battery temperature T according to an Arrhenius plot. The temperature dependencies of the first and second parameters Rd and τd coincide with the tendency of the temperature dependency of a theoretical formula. Hence, in the present embodiment, based on the measurement result of the parameters Rd and τd, each of the parameters Rd and τd is adapted by a primary expression of an inverse of the battery temperature T as shown in the solid lines shown in FIGS. 8A and 8B. According to the result of the adaptation, an Rd map and a Td map are generated.

Returning to the explanation of FIG. 4, the Rd calculation section 34c uses the Rd map based on the above expression (eq26) to calculate the first parameter Rd. The Rd map is stored in the memory 32. The τd calculation section 34e calculates the second parameter Td by using the τd map based on the above expression (eq26). The τd map is stored in the memory 32.

The resistance component calculation section 34d calculates resistance values Rw1 to Rw4 of first to fourth resistors configuring the diffusion resistance by the following expression (eq27) based on the first parameter Rd.

$$Rwm = \frac{8 \cdot Rd}{(2m-1)^2 \pi^2} \quad (eq\ 27)$$

In the above expression (eq27), m is a positive integer (in the present embodiment, m=1, 2, 3, 4). The capacity component calculation section 34f calculates capacitances Cw1 to Cw4 of first to fourth capacitors configuring the diffusion resistance by the following expression (eq28) based on the first and second parameters Rd and τd.

$$Cwm = \frac{\tau d}{2 \cdot Rd} \quad (eq\ 28)$$

The resistance value Rwm of the m-th resistance and the capacitance Cwm of the m-th capacitor can be calculated by the above expressions (eq27) and (eq28) based on the results of researches of equivalent circuits coinciding with the Warburg impedance expressed by the above expression (eq23) and the law of constants of a series of equivalent circuit which is equivalent to the Warburg impedance, based on literature and the like. Specifically, in the Foster-type equivalent circuit, when expressing the Warburg impedance by the following expression (eq29), the resistance value Rwm of the m-th resistor of the Foster-type equivalent circuit and the capacitance Cwm of the m-th capacitor are expressed by the following expressions (eq30) and (eq31).

$$Zw(s) = \frac{q2}{\sqrt{s}} \tanh\left(\frac{q1}{q2}\sqrt{s}\right) \quad \text{(eq 29)}$$

$$Rwm = \frac{8 \cdot q1}{(2m-1)^2 \pi^2} \quad \text{(eq 30)}$$

$$Cwm = \frac{q1}{2 \cdot q2^2} \quad \text{(eq 31)}$$

By comparing the above expressions (eq29) and (eq23) with each other, q1 and q2 of the above expression (eq29) are determined. As a result, the first and second parameters Rd and τd are lead as shown by the above expressions (eq27) and (eq28). Note that the above literature includes "Modelling Ni-mH battery using Causer and Foster structures. E. Kuhn et al. JOUNAL of Power Sourses 158 (2006)".

Figure 9:
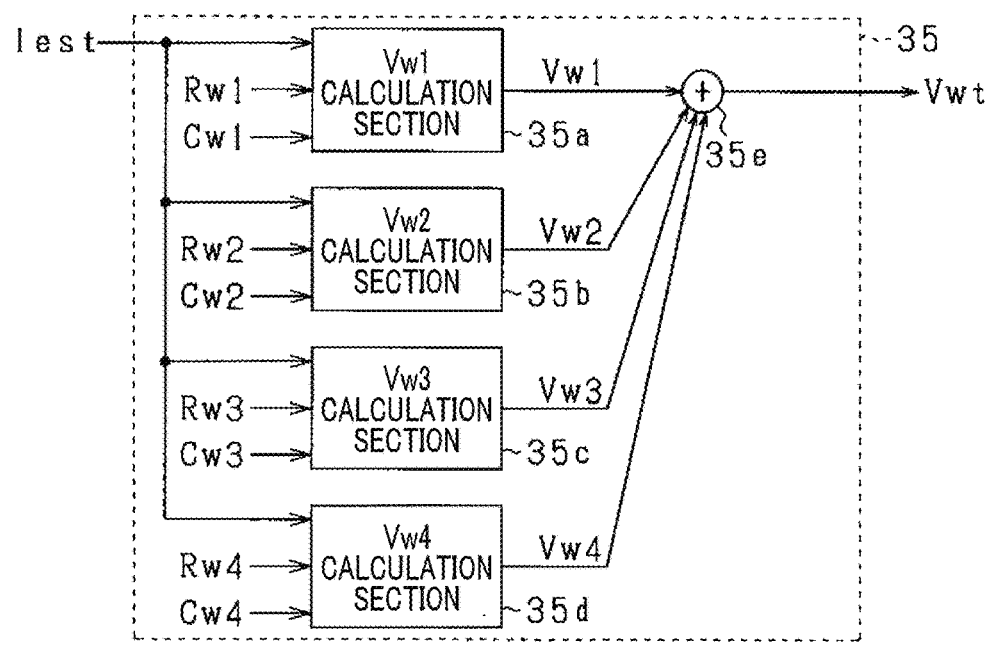
FIG. 9 is a block diagram showing a process of a voltage estimation section.

Next, with reference to FIG. 9, the voltage estimation section 35 for the diffusion region is described.

The voltage estimation section 35 for the diffusion region includes first, second, third, and fourth voltage calculation sections 35a, 35b, 35c, and 35d. The first voltage calculation section 35a calculates the first potential difference Vw1 of the diffusion resistance based on the estimation current Jest calculated by the current estimation section 36, the resistance value Rw1 calculated by the battery parameter calculation section 34, and the capacitance Cw1. In the present embodiment, the first potential difference Vw1 is calculated based on an expression obtained by discretizing a transfer function representing a parallel circuit of a resistor and a capacitor configuring a reaction resistance model. Specifically, the first potential difference Vw1 is calculated by the following expression (eq32) by receiving the first potential difference Vw1 and the estimation current Jest calculated during the last processing period and the estimation current Jest calculated during the present processing period.

$$Vw1(t) = -a1 \cdot Vw1(t-1) + b1 \cdot Iest(t) + b1 \cdot Iest(t-1) \quad \text{(eq 32)}$$

where $$a1 = \frac{\Delta T - 2 \cdot Rw1 \cdot Cw1}{\Delta T + 2 \cdot Rw1 \cdot Cw1},$$

$$b1 = \frac{\Delta T \cdot Rw1}{\Delta T + 2 \cdot Rw1 \cdot Cw1}$$

In the above expression (eq32), ΔT is a processing period. Note that the second, third, and the fourth voltage calculation sections 35b, 35c, and 35d also calculate, as in the case of the first voltage calculation section 35a, the second, third, and the fourth potential differences Vw2, Vw3, and Vw4 based on the resistance values Rw2, Rw3, and Rw4 and the capacitances Cw2, Cw3, and Cw4.

Figure 10A:
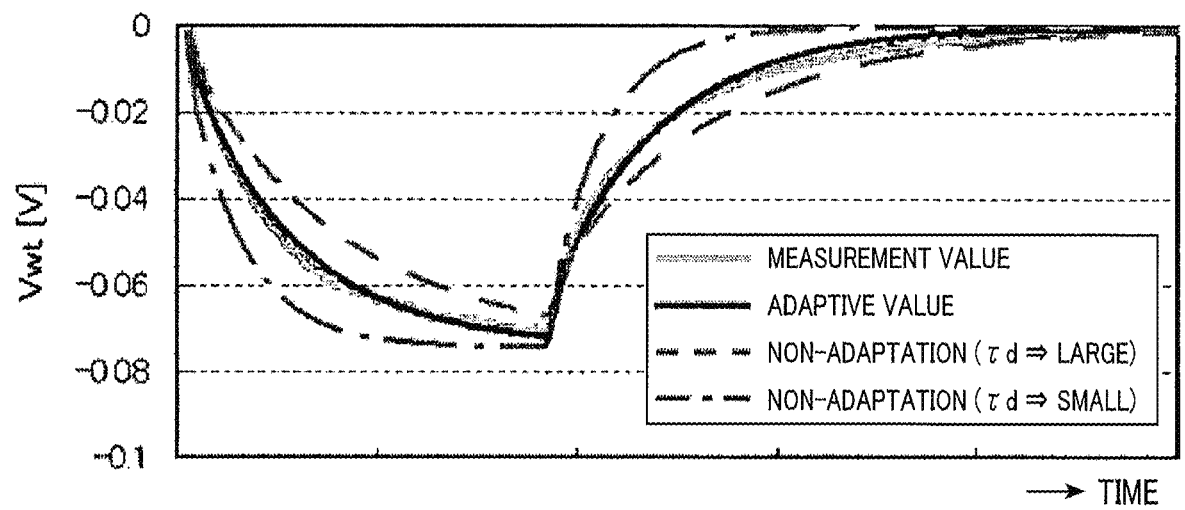
FIGS. 10A and 10B are time charts showing adaptation results of the first and second parameters.
Figure 10B:
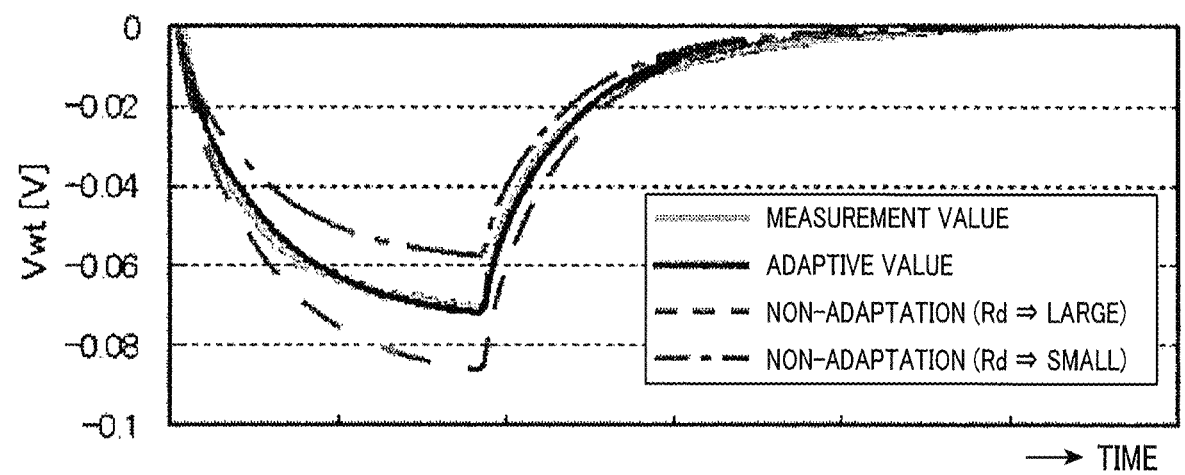

An addition section 35e calculates a diffusion resistance potential difference Vw as an additional value of the potential differences Vw1 to Vw4 calculated by the voltage calculation sections 35a to 35d. FIGS. 10A and 10B show that the diffusion resistance potential difference Vwt can be calculated with high accuracy by the first and second parameters Rd and Td. Note that, in FIG. 10, transitions of the diffusion resistance potential difference Vwt in cases where the parameters Rd and τd are increased and decreased from adaptive values thereof are also shown.

Figure 11:
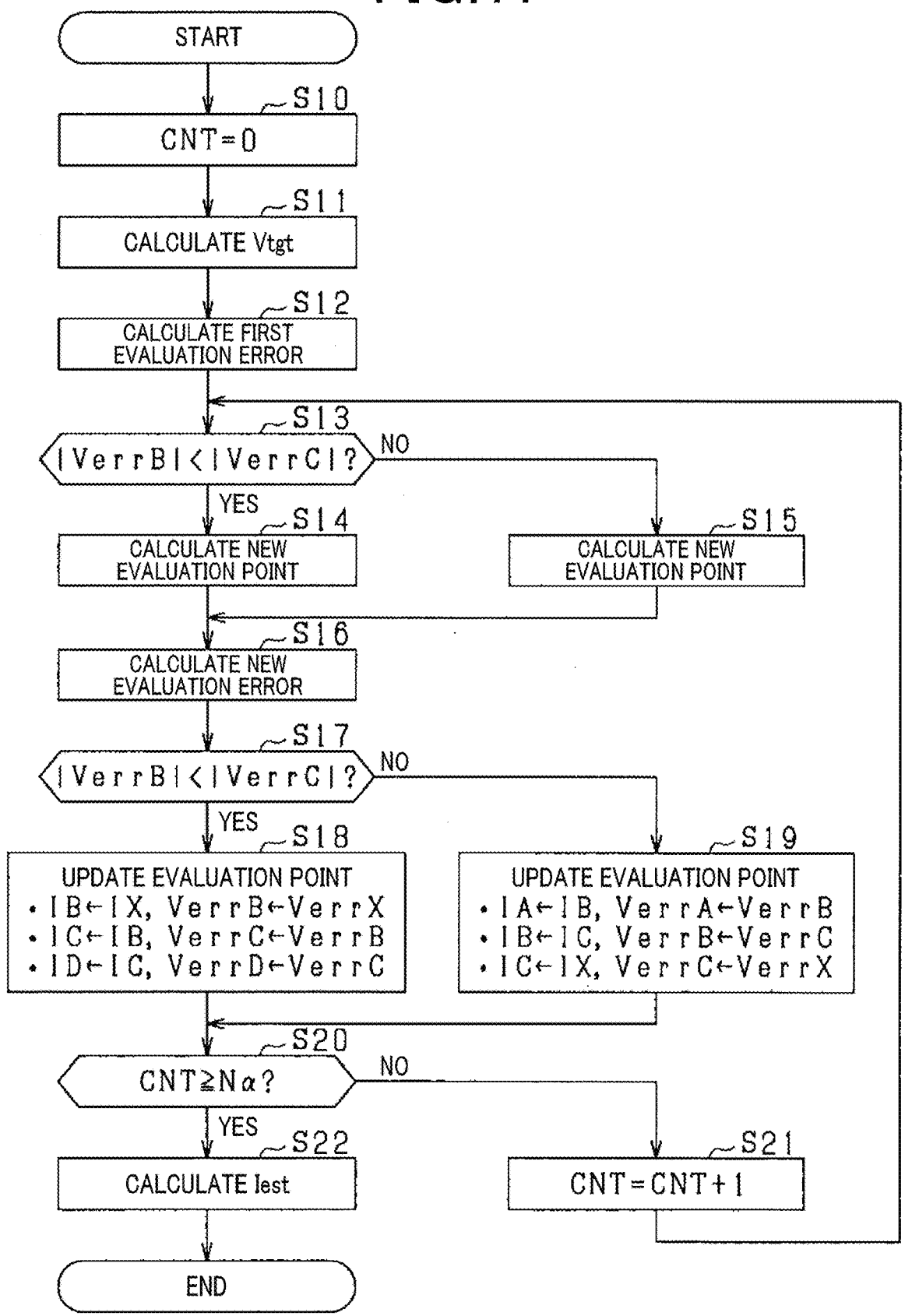
FIG. 11 is a flowchart showing a procedure of a current estimation process.

Next, with reference to FIG. 11, the process of the current estimation section 36 is described. FIG. 11 is a flowchart showing a procedure of the current estimation process based on a golden section method (GSM method). This process is repeatedly performed, for example, at predetermined intervals by the current estimation section 36 (CPU 31).

In the process, first in step S10, the current estimation section 36 sets the value of a counter CNT to 0. In successive step S11, the current estimation section 36 calculates a target voltage Vtgt by using the following expression (eq33).

$$Vtgt=Vs+\Delta V=CCV(t)-OCV(t)-Vwt(t-1) \quad \text{(eq33)}$$

In the above expression (eq33), the voltage across the terminals CCV (t) detected during the present processing period, the open end voltage OCV (t) calculated during the present processing period by the OCV estimation section 33, and the diffusion resistance potential difference Vwt (t−1) calculated during the last processing period by the voltage estimation section 35 for a diffusion region are used. The target voltage Vgt corresponds to an additional value of the potential difference Vs across the DC resistance Rs and the potential difference ΔV across the reaction resistance.

Note that, in iterative processes of the golden section method, if calculating each of the potential differences Vw1 to Vw4 of the diffusion resistance potential difference Vwt, a load of calculation in the battery ECU 30 significantly increases. To prevent this situation, in the present embodiment, on condition that the amount of change of the diffusion resistance potential difference Vwt during one processing period is substantially 0 because the diffusion resistance potential difference Vwt slowly changes, the value during the last processing period is used as the diffusion resistance potential difference Vwt, and the diffusion resistance potential difference Vwt is not calculated in iterative processes.

In successive step S12, the current estimation section 36 calculates four first evaluation errors VerrA, VerrB, VerrC, and VerrD shown in the following expression (eq34) based on the target voltage Vtgt, the DC resistance Rs, the battery temperature Ts, and the reaction resistance parameter β. In calculating the first evaluation errors, values in an interval [IA, ID] including the minimum value of a target function and a golden ratio r are used to calculate IC and ID as points internally dividing the interval at the golden ratio r. Specifically, in the present embodiment, IA is set to the maximum charging current value (e.g. 300 A) of the battery cells 20a, and ID is set to the maximum discharging current value (e.g. −300 A) of the battery cells 20a. Specifically, in the present embodiment, absolute values of IA and ID are the same. IB is a value (e.g. 70.82 A) corresponding to the golden ratio r, and IC is a value (e.g. −70.82 A) corresponding to the golden ratio r.

$$\begin{aligned} VerrA &= Vtgt - \left\{Rs \cdot IA + \frac{\alpha}{\gamma} Ts \cdot \sinh^{-1}(\beta \cdot \gamma \cdot IA)\right\} \\ VerrB &= Vtgt - \left\{Rs \cdot IB + \frac{\alpha}{\gamma} Ts \cdot \sinh^{-1}(\beta \cdot \gamma \cdot IB)\right\} \\ VerrC &= Vtgt - \left\{Rs \cdot IC + \frac{\alpha}{\gamma} Ts \cdot \sinh^{-1}(\beta \cdot \gamma \cdot IC)\right\} \\ VerrD &= Vtgt - \left\{Rs \cdot ID + \frac{\alpha}{\gamma} Ts \cdot \sinh^{-1}(\beta \cdot \gamma \cdot ID)\right\} \end{aligned} \quad \text{(eq 34)}$$

Figure 12A:
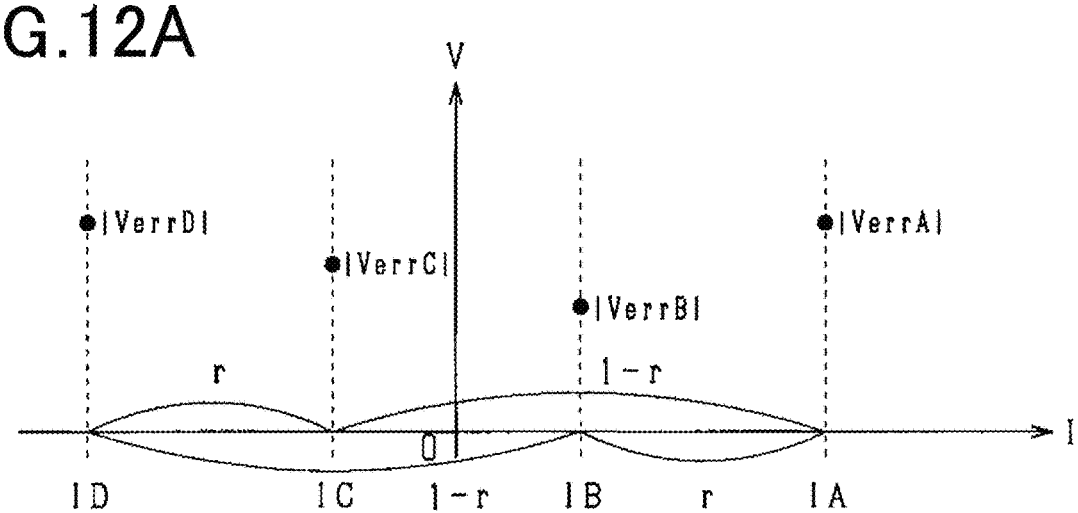
FIGS. 12A, 12B, and 12C are diagrams showing an example of an aspect of current estimation using a golden section search.

Next, in step S13, the current estimation section 36 determines whether or not the absolute value of the second evaluation error VerrB is smaller than the absolute value of the third evaluation error VerrC. If determined to be smaller in step S13 (e.g. in a case exemplified in FIG. 12A), the process proceeds to step S14 in which the current estimation section 36 calculates a new evaluation point by using the following expression (eq35).

$$IX=IA-(IA-IC) \times b \quad \text{(eq35)}$$

Figure 12B:
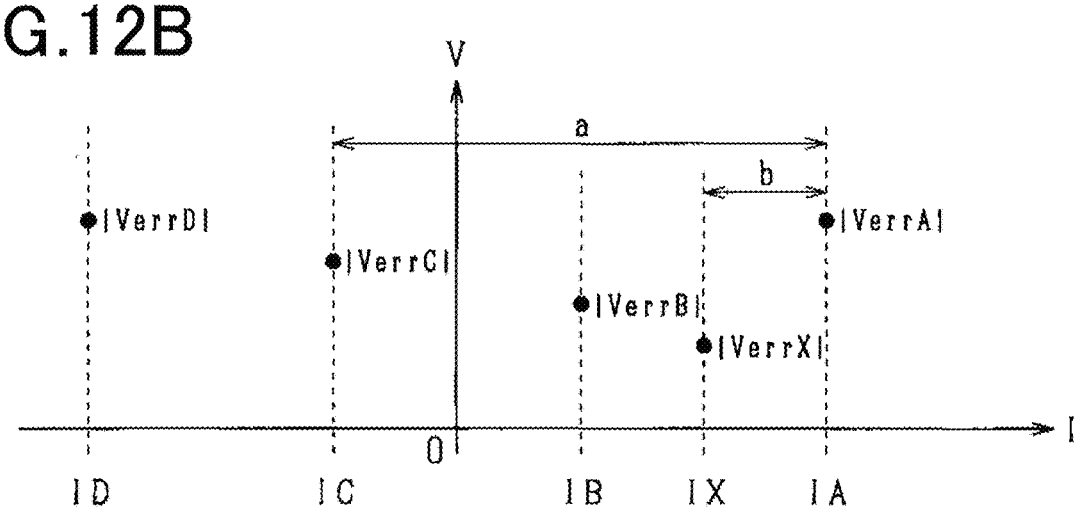

In the above expression (eq35), the constant b meets b≈0.381. FIG. 12B exemplifies a new evaluation point IX. Note that, in FIG. 12B, a=1.

Meanwhile, if negative determination is made in step S13, the process proceeds to step S15 in which the current estimation section calculates a new evaluation point by using the following expression (eq36).

$$IX=ID+(IB-IC) \times b \quad \text{(eq06)}$$

After the processes of steps S14 and S15 are completed, the process proceeds to step S16, in which a new evaluation error VerrX is calculated by using the following expression (eq37).

$$VerrX = Vtgt - \left\{ Rs \cdot IX + \frac{\alpha}{\gamma} Ts \cdot \sinh^{-1}(\beta \cdot \gamma \cdot IX) \right\} \quad \text{(eq 37)}$$

Figure 12C:
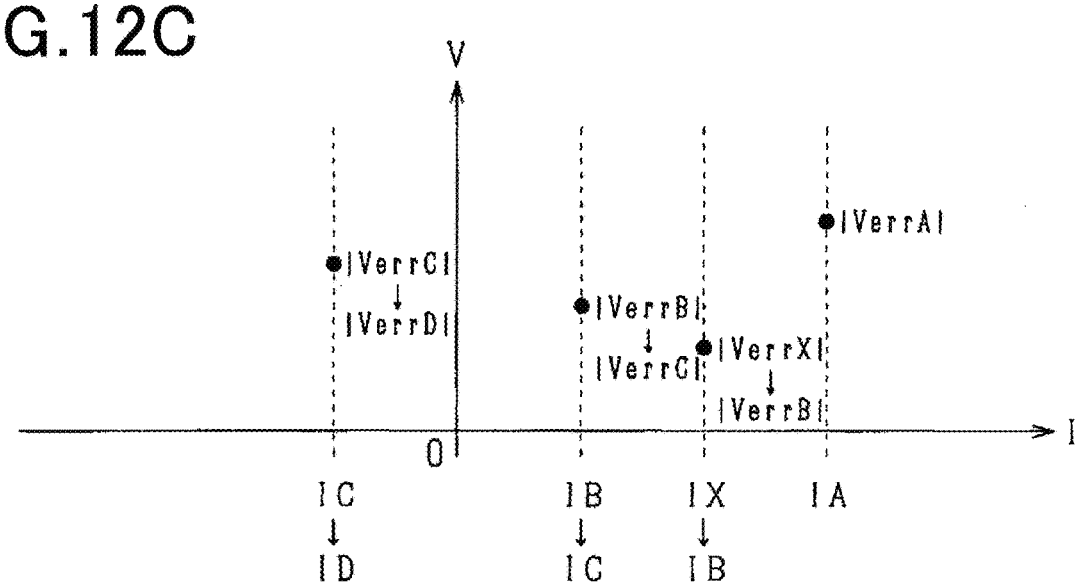

In successive step S17, the current estimation section 36 determines whether or not the absolute value of the second evaluation error VerrB is smaller than the absolute value of the third evaluation error VerrC. If determined to be smaller in step S17, the process proceeds to step S18 in which the evaluation point and the evaluation error are updated. Specifically, the second evaluation point is set to IX, the third evaluation point is set to IB, and the fourth evaluation point is set to IC. In addition, the second evaluation error is set to VerrX, the third evaluation error is set to VerrB, and the fourth evaluation error is set to VerrC. In this case, the first evaluation point IA and the first evaluation error VerrA are not updated. Note that an update manner in step S18 is exemplified in FIG. 12C.

If negative determination is made in step S17, the process proceeds to step S19 in which the current estimation section 36 updates the evaluation point and the evaluation error. Specifically, the first evaluation point is set to IB, the second evaluation point is set to IC, and the third evaluation point is set to IX. In addition, the first evaluation error is set to VerrB, the second evaluation error is set to VerrC, and the third evaluation error is set to VerrX. In this case, the fourth evaluation point ID and the fourth evaluation error VerrD are not updated.

After the processes of steps S18 and S19 are completed, the process proceeds to step S20, the current estimation section 36 determines whether or not the value of the counter CNT is equal to or more than a specified value Na (e.g. 19). If negative determination is made in step S20, in step S21, the current estimation section 36 increments the counter CNT by one, thereafter the process returns to step 13.

If positive determination is made in step S20, the process proceeds to step S22 in which the current estimation section 36 calculates an estimation current Test. In the present embodiment, the evaluation point, which corresponds to the absolute value of the evaluation error smallest among the absolute values |VerrA| to |VerrD| of the first to fourth evaluation errors, is calculated as an estimation current Test (t). Note that impedance of the diffusion resistance may be calculated by dividing the diffusion resistance potential difference Vwt by the calculated estimation current Test.

In the present embodiment, the estimation current Jest is calculated by using the golden section method because reaction resistance has a current dependency. That is, in a state where charging and discharging current is unknown, reaction resistance cannot be calculated. Thereby, the estimation current cannot be calculated by using Ohm's law. Hence, the estimation current Test is calculated by searching an evaluation point, at which the evaluation error is a value close to a target voltage, by changing a charging and discharging current value. Note that, in calculating the estimation current Jest, not only the golden section method described above but also other searching methods such as a bisection method may be used.

Next, advantages of the present embodiment will be described.

Figure 13A:
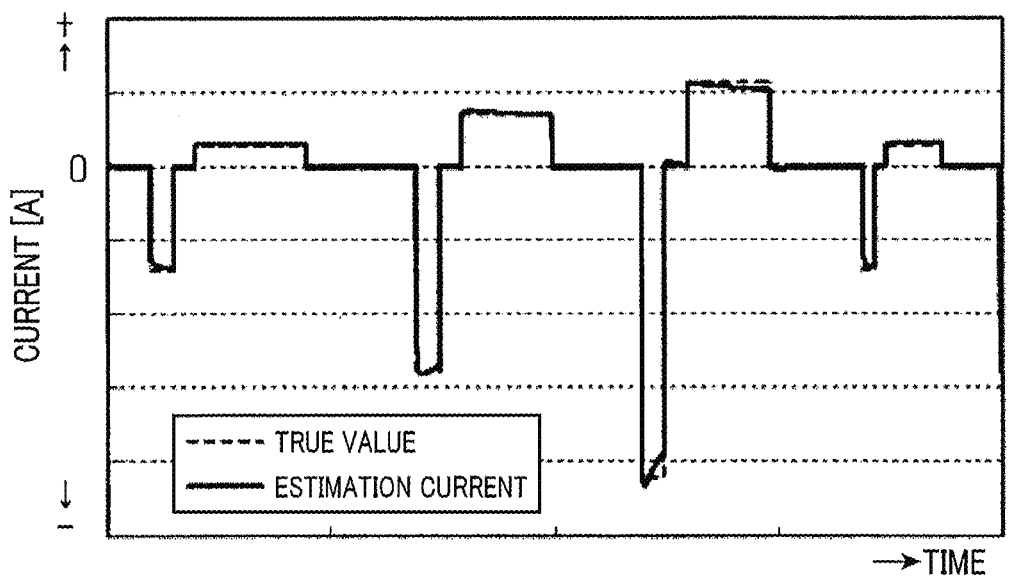
FIGS. 13A and 13B are time charts showing results of current estimation.
Figure 13B:
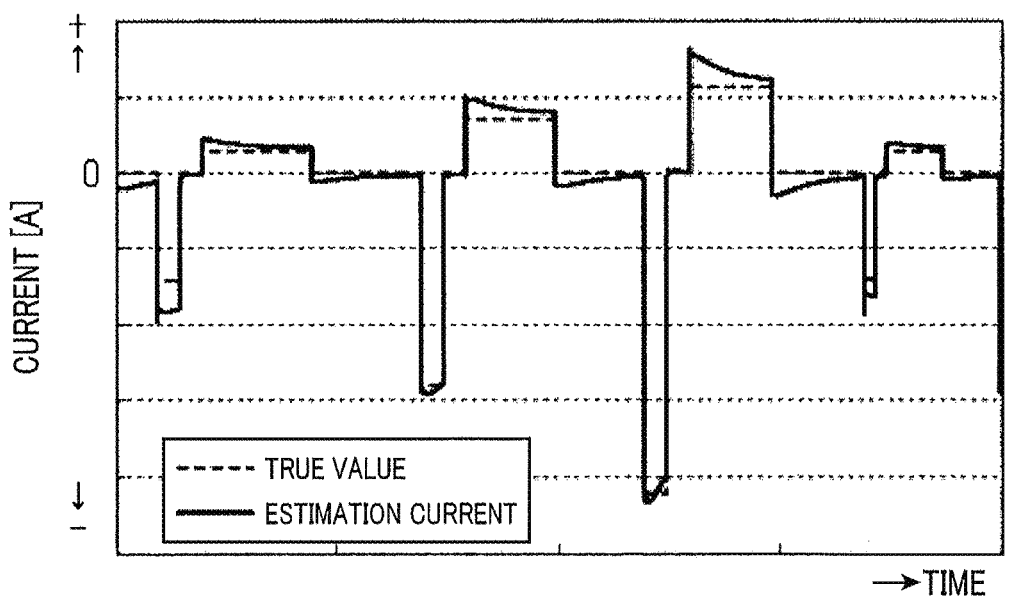

First, with reference to FIGS. 13A and 13B, accuracy in current estimation at a low temperature of −15° C. is described. In FIGS. 13A and 13B, the related art represents DC resistance and reaction resistance of a battery model as one DC resistance, and represents diffusion resistance by an equivalent circuit configured by a parallel connection of one resistor and one capacitor. At low temperature, batteries have nonlinear characteristics. Hence, as shown in FIGS. 13A and 13B, according to the present embodiment, the charging and discharging current flowing through the battery cells 20a can be estimated with high accuracy, compared with the related art in which nonlinear characteristics are not considered.

Figure 14:
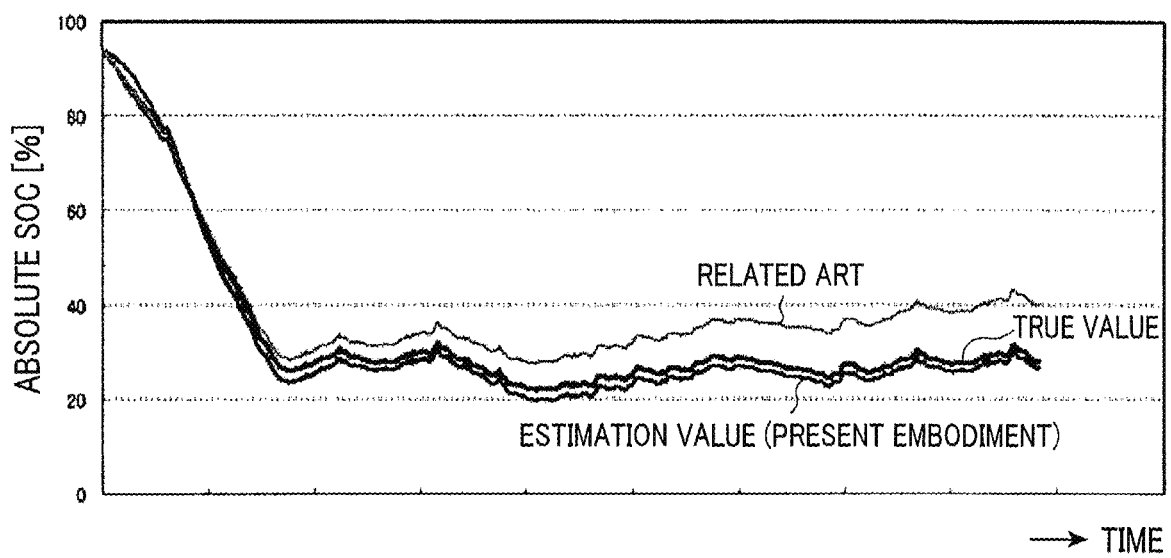
FIG. 14 is a time chart showing an estimation result of absolute SOC.

Next, with reference to FIG. 14, accuracy in estimating the absolute SOC is described. In FIG. 14, the related art is a technique for calculating the absolute SOC based on an integrated value of charging and discharging currents detected by the current sensor.

As shown in FIG. 14, in the related art, since detection errors of the current sensor are accumulated, the absolute SOC based on the value of integral of the detection value of the current sensor deviates from the true value with time. In contrast, in the present embodiment, without the influence of the detection error, the absolute SOC can be estimated with high accuracy compared with the related art.

Figure 15A:
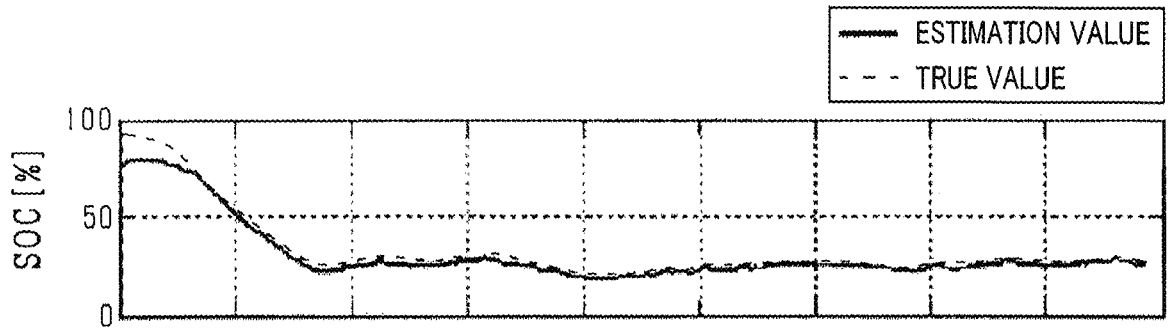
FIGS. 15A and 15B are time charts showing an SOC error reduction effect.
Figure 15B:
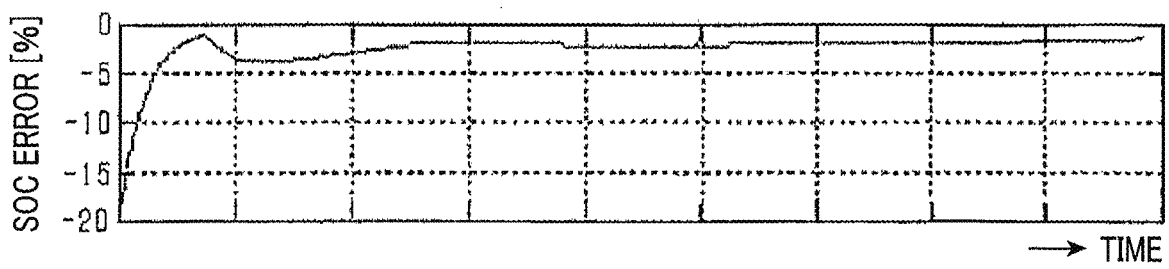

Next, with reference to FIG. 15, accuracy in estimating the absolute SOC is further explained. FIG. 15 shows that, according to the present embodiment, even when an error is caused in the first SOC0, the error can be reduced. This is because feeding back the absolute SOC estimated by the SOC estimation section 37 to the OCV estimation section 33 causes an error of the estimation current Test in the direction in which the error of the absolute SOC is reduced. Hence, in FIG. 15, the error of the absolute SOC converges on a value close to 0.

According to the present embodiment described above, the following advantages can be obtained.

(1) The reaction resistance model including the reaction resistance parameter β is used for calculating the estimation current Iest. According to the configuration, current-voltage nonlinear characteristics at low temperature can be expressed with high accuracy. Hence, charging and discharging current of the battery cells 20a and SOC can be estimated with high accuracy.

In addition, a natural logarithm of the reaction resistance parameter β is adapted in a form of a primary expression for the battery temperature Ts. Hence, generating the β map can be simplified.

(2) The diffusion resistance model using the first and second parameters Rd and τd is used for calculating the estimation current Iest. According to the configuration, battery characteristics concerning the diffusion resistance can be expressed by the first and second parameters Rd and τd with high accuracy. Hence, charging and discharging current of the battery cells 20a can be estimated with high accuracy.

In addition, the natural logarithms of the first and second parameters Rd and Td are adapted in a form of a primary expression for the battery temperature Ts. Hence, generating the Rd and Td maps can be simplified.

(3) The estimation current Jest is calculated by the golden section method. Hence, even when the reaction resistance has a current dependency, the estimation current Jest can be accurately calculated.

(4) The absolute SOC is calculated based on the integrated value of the estimation currents Test. Hence, even when an error is temporarily caused in the estimation current Jest due to influence of noise or the like, the influence of the noise or the like exerted on the accuracy in calculating the absolute SOC can be suppressed. In addition, the absolute SOC which is not dependent on the detection error of the current sensor can be calculated.

(5) The absolute SOC calculated based on the integrated value of the estimation current Iests is fed back as an input value of the OCV estimation section 33. According to the configuration, even when an error is caused in the initial SOC0, the error can be reduced. Hence, SOC can be estimated with high accuracy.

Second Embodiment

Hereinafter, the second embodiment is described focusing on the differences from the first embodiment with reference to the drawings. In the present embodiment, the process performed by the battery ECU 30 is modified.

The process performed by the battery ECU 30 is described with reference to FIG. 16. Note that, in FIG. 16, the same processes as those shown in FIG. 2 are denoted by the same reference numerals for the sake of convenience.

The battery ECU 30 includes the battery parameter calculation section 34, the voltage estimation section 35 for a diffusion region, a voltage estimation section 38 for a DC resistance section, an OCV calculation section 39, an SOC conversion section 40, an SOC correction amount calculation section 41, and an SOC estimation section 42.

The voltage estimation section 35 calculates the diffusion resistance potential difference Vwt based on the parameters Rw1, Rw2, Rw3, Rw4, Cw1, Cw2, Cw3, Cw4 calculated by the battery parameter calculation section 34 and the current (hereinafter, referred to as detection current Is) detected by the current sensor 23. Note that the diffusion resistance potential difference Vwt is calculated by changing the estimation current Test to the detection current Is in the block diagram shown in FIG. 9.

Figure 17:
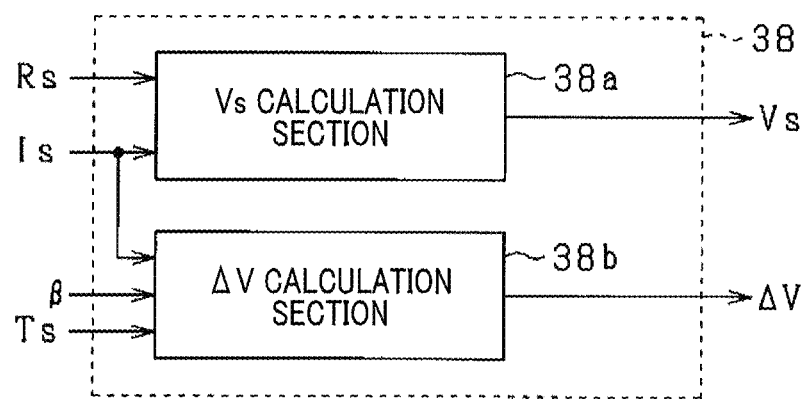
FIG. 17 is a block diagram showing a process of the voltage estimation section of a DC resistance section.

The voltage estimation section 38 calculates the potential difference Vs across the DC resistance Rs and the potential difference ΔV across the reaction resistance based on the DC resistance Rs and the reaction resistance parameter β calculated by the battery parameter calculation section 34, the battery temperature Ts, and the detection current Is. Specifically, as shown in FIG. 17, a Vs calculation section 38a calculates the potential difference Vs across a DC resistance as a value obtained by multiplying the DC resistance Rs by the detection current Is. A ΔV calculation section 38b receives the detection current Is, the battery temperature Ts, and the reaction resistance parameter β to calculate the potential difference ΔV across the reaction resistance by using the above expression (eq10).

Figure 16:
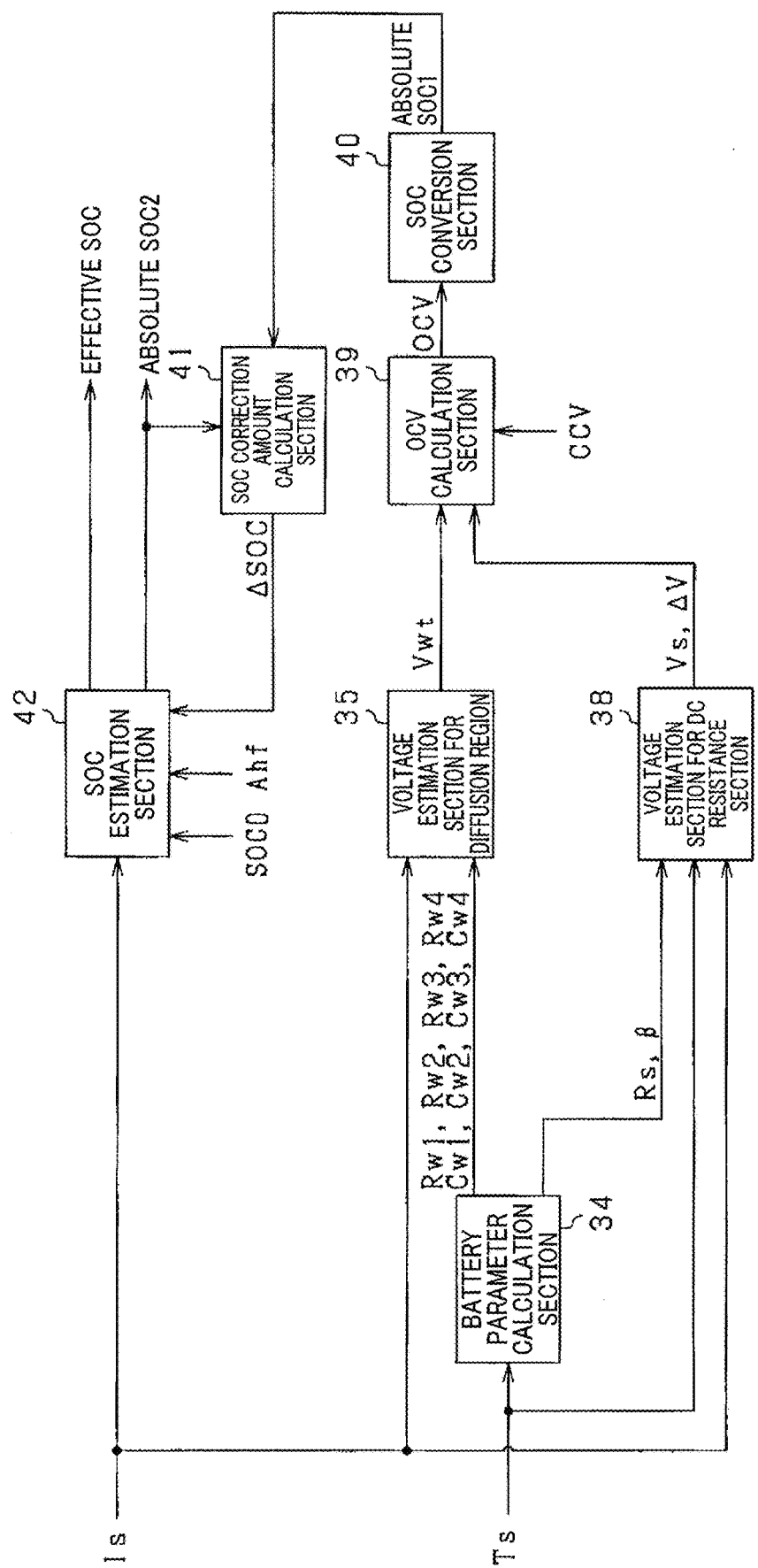
FIG. 16 is a block diagram showing a process of the battery ECU according to a second embodiment.

Returning to the explanation of FIG. 16, the OCV calculation section 39 receives the diffusion resistance potential difference Vwt calculated by the voltage estimation section 35, the potential differences Vs and ΔV calculated by the voltage estimation section 38, and the voltage across the terminals CCV of each of the battery cells 20a to calculate the open end voltage OCV by using the following expression (eq38).

$$OCV(t)=CCV(t)-Vs(t)-\Delta V(t)-Vwt(t) \tag{eq38}$$

The SOC conversion section 40 calculates a first absolute SOC1 based on the open end voltage OCV calculated by the OCV calculation section 39. In the present embodiment, the first absolute SOC1 is calculated by using a map in which the open end voltage OCV and the first absolute SOC1 are previously related to each other.

The SOC correction amount calculation section 41 calculates a correction amount ΔSOC based on the first absolute SOC1 calculated by the SOC conversion section 40 and a second absolute SOC2 calculated by an SOC estimation section 42 described later. The correction amount ΔSOC is calculated so that the deviation between the second absolute SOC2 and the first absolute SOC1 becomes 0. The correction amount ΔSOC may be calculated, for example, by proportional-integral control based on the deviation between the first absolute SOC1 and the second absolute SOC2.

The SOC estimation section 42 calculates the second absolute SOC2 by using the following expression (eq39) based on the detection current Is, the initial SOC0, the rating capacity Ah0, and the correction amount ΔSOC.

$$\text{Second absolute } SOC2 = SOC0 + \frac{\sum Is\cdot dt + \Delta SOC}{Ah0} \times 100 \tag{eq 39}$$

In addition, the SOC estimation section 42 calculates the effective SOC by using the following expression (eq40) based on the detection current Is, the initial SOC0, the full charge capacity Ahf, and the correction amount ΔSOC.

$$\text{Effective} SOC = SOC0 + \frac{\sum Is\cdot dt + \Delta SOC}{Ahf} \times 100 \tag{eq 40}$$

Using the correction amount ΔSOC can prevent the second absolute SOC2 or the effective SOC from deviating from the true value. Note that the SOCs calculated by the SOC estimation section 42 are outputted to, for example, a higher controller.

According to the present embodiment described above, the absolute SOC and the effective SOC of the battery cells 20a can be estimated with high accuracy.

Other Embodiments

Note that the above embodiments may be modified as follows.

The diffusion resistance model may be not only an equivalent circuit model in which four parallel connections of a resistor and a capacitor are connected in series but also an equivalent circuit model in which the plural (other than four) parallel connections are connected. In addition, the diffusion resistance model may be not only an equivalent circuit in which a plurality of parallel connections of a resistor and a capacitor are connected but also one equivalent circuit having one of the parallel connections.

In the above embodiments, the map in which the DC resistance Rs related to the temperature of the secondary battery is specified is stored in a memory as information on the DC resistance. For example, an expression specifying the DC resistance Rs related to the temperature of the secondary battery may be stored in the memory as information on the DC resistance.

In addition, in the above embodiments, the map in which the reaction resistance parameter β related to the temperature of the secondary battery is specified is stored in a memory as information on the reaction resistance. However, for example, an expression specifying the reaction resistance parameter β related to the temperature of the secondary battery may be stored in the memory as information on the reaction resistance. Even in this case, adapting the natural logarithm of the reaction resistance parameter β in a form of a primary expression for the battery temperature Ts or the inverse of the battery temperature Ts can simplify generating the expression.

Furthermore, in the above embodiments, the map in which the first and second parameters Rd and τd related to the temperature of the secondary battery is specified is stored in a memory as information on the diffusion resistance. For example, an expression specifying the first and second parameters Rd and τd related to the temperature of the secondary battery may be stored in the memory as information on the diffusion resistance. Even in this case, adapting the natural logarithm of the first and second parameters Rd and τd in a form of a primary expression for the inverse of the battery temperature Ts can simplify generating the expression.

In the above embodiments, the reaction resistance parameter β may be adapted not only in a form of a primary expression for the battery temperature or the inverse of the battery temperature but also, for example, in a form of a quadratic or higher expression for the inverse of the battery temperature.

The secondary battery may be not only a lithium-ion secondary battery but also another secondary battery such as a nickel hydride battery.

In the above first embodiment, the current estimation process described above may be performed as a fail-safe of the current sensor in the event of failure. In addition, in the above first embodiment, the battery pack 10 may not be provided with the battery sensor 23.

In the above embodiments, the battery temperature used in each of the processes may be not only the detection value of the temperature sensor 22 but also battery temperature estimated by any method.

To estimate the state of the secondary battery, not only the charging and discharging current but also, for example, internal impedance (DC resistance+reaction resistance+diffusion resistance) of the secondary battery may be estimated. For example, as shown in FIG. 6, the reaction resistance may be calculated as an inclination of the change of the potential difference ΔV with respect to the change of the charging and discharging current I. In this case, for example, degeneration of the secondary battery may be diagnosed based on the estimated internal impedance.

The battery state estimation apparatus according to the above embodiments is not limited to be applied a vehicle.

Hereinafter, aspects of the above-described embodiments will be summarized.

According to the embodiment, a battery state estimation apparatus estimates a state of a secondary battery (20a) based on a battery model of the secondary battery. The battery model includes: a DC resistance model which expresses DC resistance (Rs) of the secondary battery; a reaction resistance model which expresses reaction resistance of the secondary battery and is derived from a Butler-Volmer equation, and which includes a reaction resistance parameter (β) correlated with an exchange current density; and a diffusion resistance model which is an equivalent circuit model in which a plurality of parallel connections of a resistor and a capacitor are connected in series, and expresses diffusion resistance of the secondary battery, the diffusion resistance including a common first parameter (Rd) which determines a resistance value (Rw1, Rw2, Rw3, Rw4) of each of the resistors and capacitance (Cw1, Cw2, Cw3, Cw4) of each of the capacitors, and a common second parameter (τd) which determines the capacitance of each of the capacitors. The apparatus includes: a DC information storage section which stores information on the DC resistance related to temperature of the secondary battery; a reaction information storage section which stores information on the reaction resistance parameter related to the temperature of the secondary battery; a diffusion information storage section which stores information on each of the first parameter and the second parameter related to the temperature of the secondary battery; and a state estimation section which calculates the DC resistance, the reaction resistance parameter, the first parameter, and the second parameter from the information stored in the DC information storage section, the reaction information storage section, and the diffusion information storage section, by using the temperature of the secondary battery as input, and estimates the state of the secondary battery based, on the calculated DC resistance, reaction resistance parameter, first parameter, and second parameter.

Internal resistance of the secondary battery is broadly divided into DC resistance, reaction resistance, and diffusion resistance. Hence, in the above embodiments, the battery model is configured by the DC resistance model, the reaction resistance model, and the diffusion resistance model.

In the secondary battery at low temperature, current-voltage nonlinear characteristics due to reaction resistance become dominant. Hence, according to the embodiments, a reaction resistance model is derived from the Butler-Volmer equation in electrochemistry and expresses the nonlinear characteristics of the secondary battery. Specifically, the model is a parameter corresponding to an exchange current density of the Butler-Volmer equation and includes a reaction resistance parameter having a correlation with the temperature. The reaction resistance parameter depends on the temperature of the secondary battery. Hence, changing a value of the reaction resistance parameter according to the temperature can express the current-voltage nonlinear characteristics at low temperature with high accuracy, which cannot be expressed by conventional art.

In addition, the diffusion resistance model is expressed by an equivalent circuit model in which a plurality of parallel connections of a resistor and a capacitor are connected in series. The first and second parameters determining a resistance value of each resistor and a capacitance of each capacitor depend on the temperature of the secondary battery. Hence, changing values of the first and second parameters according to the temperature can increase the accuracy of the battery model. Specifically, according to the present embodiments, the resistance value of each resistor can be determined by the common first parameter, and the capacitance of each capacitor can be determined by the common first and second parameters. Therefore, the battery model can be expressed by smaller number of parameters.

In the above embodiments, each of the parameters described above is stored in each of the storage sections in a state where the parameters are related to temperature. The state of the secondary battery at low temperature can be estimated with high accuracy by the state estimation section based on the information stored in each of the storage sections.

It will be appreciated that the present invention is not limited to the configurations described above, but any and all modifications, variations or equivalents, which may occur to those who are skilled in the art, should be considered to fall within the scope of the present invention.

What is claimed is:

1. A battery state estimation apparatus which estimates a state of a secondary battery based on a battery model of the secondary battery, wherein the battery model comprises:

a DC resistance model which expresses DC resistance of the secondary battery;

a reaction resistance model which expresses reaction resistance of the secondary battery and is derived from a Butler-Volmer equation, which includes a reaction resistance parameter correlated with an exchange current density, and which has nonlinear characteristics between a current flowing through the second battery and a potential difference across the reaction resistance; and a diffusion resistance model which is an equivalent circuit model in which a plurality of parallel connections of a resistor and a capacitor are connected in series, and expresses diffusion resistance of the secondary battery, the diffusion resistance including a common first parameter which determines a resistance value of each of the resistors and capacitance of each of the capacitors, and a common second parameter which determines the capacitance of each of the capacitors, wherein a resistance value of the resistor of the m-th (m is a positive integer) parallel connection is expressed by the following expression:

$$Rwm = \frac{8 \cdot Rd}{(2m-1)^2 \pi^2}$$

where Rwm is a resistance value of the resistor of the m-th parallel connection configuring the equivalent circuit, Cwm is a capacitance of the capacitor, Rd is the first parameter, and τd is the second parameter, and the capacitance of the capacitor of the m-th parallel connection is expressed by the following expression:

$$Cwm = \frac{\tau d}{2 \cdot Rd},$$

the apparatus comprising:

a DC information storage section which stores information on the DC resistance related to temperature of the secondary battery;

a reaction information storage section which stores information on the reaction resistance parameter related to the temperature of the secondary battery;

a diffusion information storage section which stores information on each of the first parameter and the second parameter related to the temperature of the secondary battery wherein the diffusion information storage section stores the information on the first parameter as information on a primary expression in which a logarithm of the first parameter is a dependent variable, and an inverse of the temperature of the secondary battery is an independent variable, and stores the information on the second parameter as information on a primary expression in which a logarithm of the second parameter is a dependent variable, and an inverse of the temperature of the secondary battery is an independent variable;

a state estimation section which calculates the DC resistance, the reaction resistance parameter, the first parameter, and the second parameter from the information stored in the DC information storage section, the reaction information storage section, and the diffusion information storage section, by using the temperature of the secondary battery as input, and estimates the state of the secondary battery based on the calculated DC resistance, reaction resistance parameter, first parameter, and second parameter, thereby estimating non-linear characteristics of the secondary battery and enabling a measurement with high accuracy even at low temperatures;

a voltage across terminals detection section which detects a voltage across terminals of the secondary battery using a voltage sensor coupled to the terminals of the secondary battery;

a current detection section which detects a current flowing through the secondary battery; and an open end voltage estimation section which estimates an open end voltage of the secondary battery, wherein the state estimation section includes:

a DC voltage calculation section which calculates the DC resistance from the information stored in the DC information storage section by using the temperature of the secondary battery as input, and calculates a potential difference across the DC resistance based on the calculated DC resistance;

a diffusion voltage calculation section which calculates the first parameter and the second parameter from the information stored in the diffusion information storage section by using the temperature of the secondary battery as input, and calculates a potential difference across the diffusion resistance based on the calculated first parameter and second parameter;

a reaction voltage calculation section which calculates the reaction resistance parameter from the information stored in the reaction information storage section by using the temperature of the secondary battery as input, and calculates a potential difference across the reaction resistance based on the calculated reaction resistance parameter;

a target voltage calculation section which calculates a target voltage by subtracting an additional value of the open end voltage estimated by the open end voltage estimation section and the potential difference across the diffusion resistance calculated by the diffusion voltage calculation section from the voltage across the terminals detected by the voltage across terminals detection section;

a current estimation section which estimates a current flowing through the secondary battery, by the current which a difference between the target voltage and an additional value of the potential difference across the DC resistance calculated by the DC voltage calculation section and the potential difference across the reaction resistance calculated by the reaction voltage calculation section becomes 0;

an open end voltage calculation section which calculates an open end voltage of the secondary battery by subtracting an additional value of a potential difference across the diffusion resistance calculated by the diffusion voltage calculation section, a potential difference across the DC resistance calculated by the DC voltage calculation section, and a potential difference across the reaction resistance calculated by the reaction voltage calculation section, from the voltage across terminals detected by the voltage across terminals detection section;

a first SOC calculation section which calculates a first SOC of the secondary battery based on the open end voltage calculated by the open end voltage calculation section;

a second SOC calculation section which calculates a second SOC of the secondary battery based on an integrated value of the currents detected by the current detection section;

a correction amount calculation section which calculates a correction amount by which a difference between the second SOC calculated by the second SOC calculation section and the first SOC calculated by the first SOC calculation section becomes 0; and a correction section which corrects the second SOC calculated by the second SOC calculation section by the correction amount calculated by the correction amount calculation section, and wherein the current estimation section searches a current flowing through the secondary battery, by the current which the difference becomes minimum, according to iterative processes using a predetermined searching method, and estimates the searched current as the current flowing through the secondary battery, and the target voltage calculation section calculates the target voltage using a value calculated during the previous processing period in a current estimation process by the current estimation section as the potential difference of the reaction resistance.

2. The battery state estimation apparatus according to claim 1, wherein
the reaction resistance parameter meets the following expression:

$$I = \frac{1}{\gamma \cdot \beta} \sinh\left(\frac{\gamma}{\alpha} \cdot \frac{1}{T} \Delta V\right)$$

where α and γ are constants, I is a current flowing through the second battery, T is a temperature of the second battery, and ΔV is a potential difference of the reaction resistance.

3. The battery state estimation apparatus according to claim 2, wherein the reaction information storage section stores the information on the reaction resistance parameter as information on a primary expression in which a logarithm of the reaction resistance parameter is an independent variable, and an inverse of the temperature of the secondary battery or the temperature of the secondary battery as an independent variable.

4. The battery state estimation apparatus according to claim 1, wherein the state estimation section includes a further SOC calculation section which calculates an SOC of the secondary battery based on an integrated value of the currents estimated by the current estimation section, and the open end voltage estimation section estimates the open end voltage based on the SOC calculated by the further SOC calculation section.

5. A battery state estimation apparatus which estimates a state of a secondary battery based on a battery model of the secondary battery, wherein
the battery model comprises:
a DC resistance model which expresses DC resistance of the secondary battery;
a reaction resistance model which expresses reaction resistance of the secondary battery and is derived from a Butler-Volmer equation, and which includes a reaction resistance parameter correlated with an exchange current density and which has nonlinear characteristics between a current flowing through the second battery and a potential difference across the reaction resistance; and
a diffusion resistance model which is an equivalent circuit model in which a plurality of parallel connections of a resistor and a capacitor are connected in series, and expresses diffusion resistance of the secondary battery, the diffusion resistance including a common first parameter which determines a resistance value of each of the resistors and capacitance of each of the capacitors, and a common second parameter which determines the capacitance of each of the capacitors, wherein a resistance value of the resistor of the m-th (m is a positive integer) parallel connection is expressed by the following expression:

$$Rwm = \frac{8 \cdot Rd}{(2m-1)^2 \pi^2}$$

where Rwm is a resistance value of the resistor of the m-th parallel connection configuring the equivalent circuit, Cwm is a capacitance of the capacitor, Rd is the first parameter, and td is the second parameter, and the capacitance of the capacitor of the m-th parallel connection is expressed by the following expression:

$$Cwm = \frac{\tau d}{2 \cdot Rd};$$

and
the apparatus comprises:
a memory configured to:
store information on the DC resistance related to temperature of the secondary battery,
store information on the reaction resistance parameter related to the temperature of the secondary battery,
store information on each of the first parameter and the second parameter related to the temperature of the secondary battery, wherein the memory stores the information on the first parameter as information on a primary expression in which a logarithm of the first parameter is a dependent variable, and an inverse of the temperature of the secondary battery is an independent variable, and stores the information on the second parameter as information on a primary expression in which a logarithm of the second parameter is a dependent variable, and an inverse of the temperature of the secondary battery is an independent variable;

a sensor configured to detect a voltage across terminals of the secondary battery, the sensor being a voltage sensor coupled to the terminals of the secondary battery; and a processor communicatively coupled to the memory and the sensor, the processor programmed to:
calculate the DC resistance, the reaction resistance parameter, the first parameter, and the second parameter from the information stored in the memory, by using the temperature of the secondary battery as input, and estimates the state of the secondary battery based on the calculated DC resistance, reaction resistance parameter, first parameter, and second parameter, thereby estimating non-linear characteristics of the secondary battery and enabling a measurement with high accuracy even at temperatures of 0° C. or less, estimate an open end voltage of the secondary battery, calculate the DC resistance from the information stored in the memory by using the temperature of the secondary battery as input, and calculate a potential difference across the DC resistance based on the calculated DC resistance, calculate the first parameter and the second parameter from the information stored in the memory by using the temperature of the secondary battery as input, and calculate a potential difference across the diffusion resistance based on the calculated first parameter and second parameter, calculate the reaction resistance parameter from the information stored in the memory by using the temperature of the secondary battery as input, and calculate a potential difference across the reaction resistance based on the calculated reaction resistance parameter, calculate a target voltage by subtracting an additional value of the estimated open end voltage and the calculated potential difference across the diffusion resistance from the voltage across the terminals detected using the sensor, estimate a current flowing through the secondary battery, by the current which a difference between the target voltage and an additional value of the calculated potential difference across the DC resistance and the calculated potential difference across the reaction resistance becomes 0, search a current flowing through the secondary battery, by the current which the difference becomes minimum, according to iterative processes using a predetermined searching method, and estimate the searched current as the current flowing through the secondary battery, and calculate the target voltage using a value calculated during the previous processing period in a current estimation process as the potential difference of the reaction resistance.

6. The battery state estimation apparatus according to claim 5, wherein the processor is further programmed to:
detect a voltage across terminals of the secondary battery using the voltage sensor coupled to the terminals of the secondary battery;
detect a current flowing through the secondary battery;
calculate an open end voltage of the secondary battery by subtracting an additional value of the calculated potential difference across the diffusion resistance, the calculated potential difference across the DC resistance, and the calculated potential difference across the reaction resistance, from the detected voltage across terminals;
calculate a first SOC of the secondary battery based on the calculated open end voltage;
calculates a second SOC of the secondary battery based on an integrated value of the detected currents;
calculate a correction amount by which a difference between the second SOC and the first SOC calculated becomes 0; and
correct the second SOC by the correction amount.

* * * * *